US011908656B2

(12) United States Patent
Severt et al.

(10) Patent No.: US 11,908,656 B2
(45) Date of Patent: Feb. 20, 2024

(54) STAGE APPARATUS SUITABLE FOR A PARTICLE BEAM APPARATUS

(71) Applicant: ASML Netherlands B.V., Veldhoven (NL)

(72) Inventors: Han Willem Hendrik Severt, Beek en Donk (NL); Jan-Gerard Cornelis Van Der Toorn, Eindhoven (NL); Ronald Van Der Wilk, Knegsel (NL); Allard Eelco Kooiker, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 141 days.

(21) Appl. No.: 17/497,761

(22) Filed: Oct. 8, 2021

(65) Prior Publication Data
US 2022/0028648 A1 Jan. 27, 2022

Related U.S. Application Data

(63) Continuation of application No. PCT/EP2020/058454, filed on Mar. 26, 2020.

(30) Foreign Application Priority Data

Apr. 10, 2019 (EP) .................................... 19168375

(51) Int. Cl.
*H01J 37/20* (2006.01)
*H01J 37/26* (2006.01)
*H01J 37/28* (2006.01)
(52) U.S. Cl.
CPC ............ *H01J 37/20* (2013.01); *H01J 37/261* (2013.01); *H01J 37/28* (2013.01);
(Continued)

(58) Field of Classification Search
CPC .......... H01J 37/28; H01J 37/20; H01J 37/244; H01J 37/265; H01J 2237/2802; H01J 2237/202; G01N 23/225
See application file for complete search history.

(56) References Cited

U.S. PATENT DOCUMENTS 5,751,538 A 5/1998 Nakasuji
6,819,404 B2 11/2004 Tanaka
(Continued)

FOREIGN PATENT DOCUMENTS

CN 1525534 A 9/2004
EP 1 391 786 B1 10/2010
(Continued)

OTHER PUBLICATIONS

Taiwanese Office Action issued by the ROC in related Application No. 109111970, dated May 28, 2021 (12 pgs.).
(Continued)

*Primary Examiner* — David A Vanore
(74) *Attorney, Agent, or Firm* — Finnegan, Henderson, Farbow, Garrett & Dunner, LLP

(57) ABSTRACT

A stage apparatus for a particle-beam apparatus is disclosed. A particle beam apparatus may comprise a conductive object and an object table, the object table being configured to support an object. The object table comprises a table body and a conductive coating, the conductive coating being provided on at least a portion of a surface of the table body. The conductive object is disposed proximate to the conductive coating and the table body is provided with a feature proximate to an edge portion of the conductive coating. Said feature is arranged so as to reduce an electric field strength in the vicinity of the edge portion of the conductive coating when a voltage is applied to both the conductive object and the conductive coating.

21 Claims, 15 Drawing Sheets

(52) U.S. Cl.
CPC .................. *H01J 2237/0206* (2013.01); *H01J 2237/04756* (2013.01); *H01J 2237/24592* (2013.01)

(56) References Cited

U.S. PATENT DOCUMENTS

| | | | |
|---|---|---|---|
| 7,786,658 B1 | 8/2010 | Tanaka et al. | |
| 2008/0023706 A1* | 1/2008 | Saito | H01L 29/7787 257/E29.253 |
| 2011/0036990 A1* | 2/2011 | Stone | H01J 37/32412 250/492.3 |
| 2011/0095185 A1* | 4/2011 | Miya | H01L 22/10 250/311 |
| 2012/0024585 A1 | 2/2012 | Hilbers et al. | |
| 2012/0292509 A1* | 11/2012 | Wang | H01J 37/026 361/222 |
| 2013/0164684 A1 | 6/2013 | Yamanaka | |
| 2013/0248738 A1* | 9/2013 | Suuronen | H01J 37/3171 250/492.21 |
| 2013/0273478 A1 | 10/2013 | Sano et al. | |
| 2014/0319345 A1 | 10/2014 | Hatakeyama et al. | |
| 2015/0138688 A1* | 5/2015 | Hilbers | G03F 7/70708 361/234 |
| 2017/0047193 A1 | 2/2017 | Jiang et al. | |
| 2018/0053739 A1* | 2/2018 | Seddon | H01L 21/4853 |
| 2021/0013016 A1* | 1/2021 | Tsuto | H01L 21/68742 |
| 2021/0175086 A1* | 6/2021 | Abhinand | H01L 21/6831 |
| 2022/0392793 A1* | 12/2022 | Buxbaum | G06T 7/0004 |
| 2022/0415719 A1* | 12/2022 | Chen | H01L 21/67213 |

FOREIGN PATENT DOCUMENTS

| | | |
|---|---|---|
| EP | 2 508 903 B1 | 10/2012 |
| JP | 2006054094 A | 2/2006 |
| JP | 2009141220 A | 6/2009 |
| JP | 2015529968 A | 10/2015 |
| TW | 201032258 A | 9/2010 |
| TW | 201303286 A | 1/2013 |
| WO | WO 2009/157182 A1 | 12/2009 |
| WO | WO 2018/154705 A1 | 8/2018 |
| WO | WO 02/080185 A1 | 10/2020 |

OTHER PUBLICATIONS

Notice of Reasons for Rejection issued by the Japan Patent Office in related Japanese Patent Application No. 2021-557005; dated Oct. 19, 2022 (9 pgs.).

Office Action of the Intellectual Property Office of Taiwan issued in related Taiwanese Patent Application No. 111113170; dated Feb. 3, 2023 (9 pgs.).

* cited by examiner

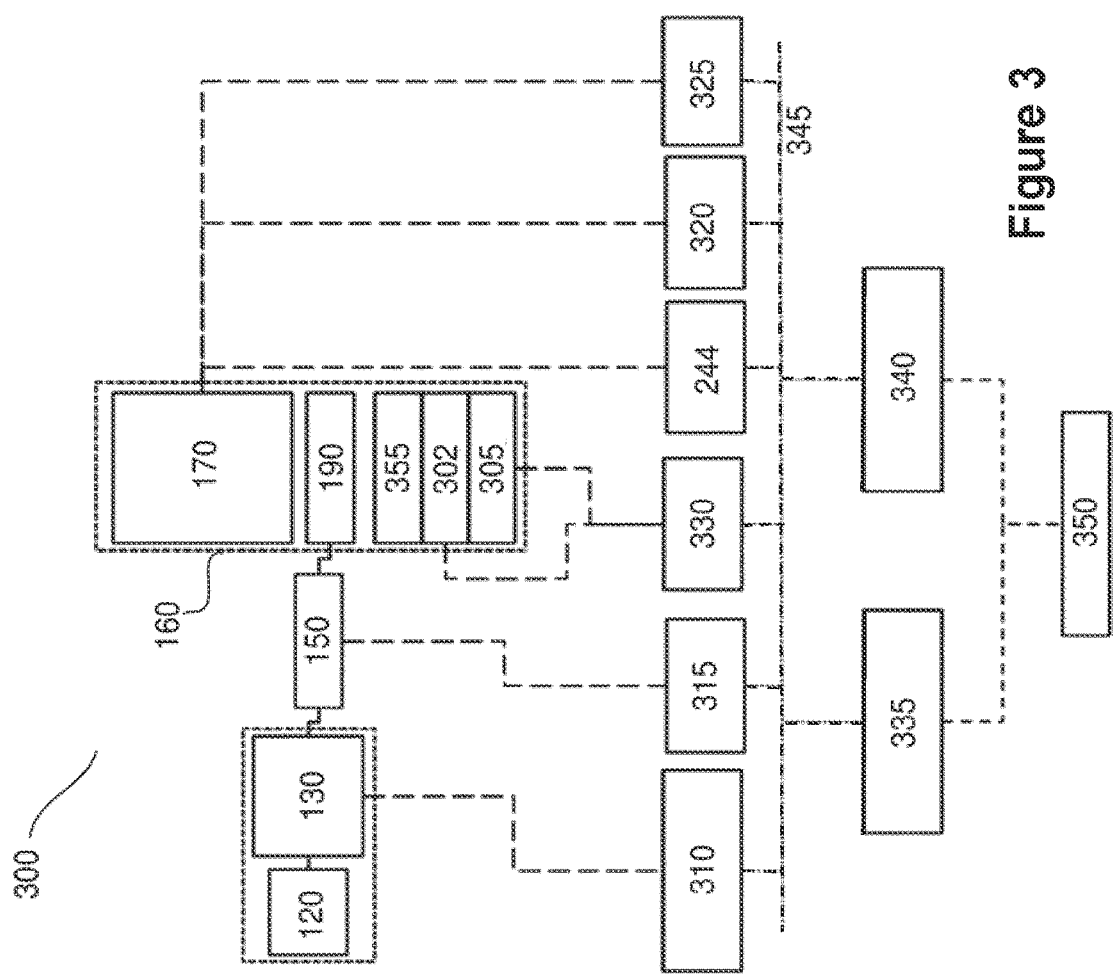

STAGE APPARATUS SUITABLE FOR A PARTICLE BEAM APPARATUS

CROSS-REFERENCE TO RELATED APPLICATIONS

This application claims priority to International Application No. PCT/EP2020/058454, filed Mar. 26, 2020, and published as WO 2020/207805A1, which claims priority of EP application 19168375.4 which was filed on Apr. 10, 2019. The contents of these applications are herein incorporated by reference in their entireties.

TECHNICAL FIELD

The embodiments of the present disclosure relate to a stage apparatus, and more particularly to a stage apparatus for a particle beam apparatus or a charged-particle beam system.

BACKGROUND

In semiconductor fabrication processes, defects are inevitably generated. Such defects may negatively impact device performance, and in some cases, failure of the devices as well. Device yield may thus be impacted, resulting in increased costs. To control semiconductor process yield, defect monitoring is important. One tool useful in defect monitoring is an SEM (Scanning Electron Microscope) apparatus which scans a target portion of a specimen using one or more beams of electrons. An SEM is an example of a particle beam apparatus used for defect inspection and defect monitoring.

It may be desirable to provide a new particle beam apparatus, which may be used as part of an inspection apparatus, and which at least partially addresses one or more problems associated with prior art SEM apparatuses.

SUMMARY

The embodiments of the present disclosure relate to a particle beam apparatus.

One aspect of the present disclosure provides a particle beam apparatus, comprising: a conductive object; and an object table configured to support an object, the object table comprising: a table body; and a conductive coating provided on at least a portion of a surface of the table body; wherein the conductive object is disposed such that at least part of the conductive object faces the conductive coating, and wherein the table body is provided with a feature at or near an edge portion of the conductive coating, said feature being arranged so as to reduce an electric field strength in the vicinity of the edge portion when a voltage is applied to both the conductive object and the conductive coating.

Another aspect of the present disclosure provides a particle beam apparatus that may form part of, for example, a scanning electron microscope (SEM) apparatus. Such an SEM apparatus may be useful for inspecting an object (e.g., a silicon wafer, a reticle). The portion of a surface of the table body on which a conductive coating is provided may be used to support a silicon wafer. The conductive object may be provided to decelerate electrons in an electron beam that are incident on a silicon wafer when being inspected using an SEM apparatus. This may be useful to prevent damage to the silicon wafer. The conductive object may be provided to accelerate secondary electrons and backscattered electrons towards a detector in an SEM apparatus.

When the particle beam apparatus is used as part of an SEM apparatus, the conductive coating may be held at a similar electric potential to the electric potential of the conductive object (which may be, for example, of the order of −10 kV, e.g. −10, −20, −30, −40, −50, −60, −70, −80, −90, or −100 kV). This may be useful to reduce an electric field strength in the vicinity of the silicon wafer when supported on the surface of the table body on which a conductive coating is provided. In turn, this may reduce the effect of such an electric field on measurements made by the SEM apparatus. The conductive object may be generally planar. To achieve said reduction of electric field strength in the vicinity of the silicon wafer, the conductive coating (and portion of a surface of the table body on which a conductive coating is provided) may also be generally planar and may be arranged to be substantially parallel to the conductive object.

In general, components surrounding the particle beam apparatus may be at a different electrical potential to that of the conductive object and conductive coating of the particle beam apparatus. For example, a vacuum chamber in which the particle beam apparatus is disposed may be connected to an electric ground. An electric field may therefore exist between these external components and the conductive object and conductive coating of the particle beam apparatus. The separation between the particle beam apparatus and components surrounding the particle beam apparatus may be much larger than the separation between the conductive object and the conductive coating of the particle beam apparatus. For a sufficiently small gap between the conductive object and the conductive coating, the electrical field may be similar to if the conductive object and conductive coating were a single conductor, with lines of electric equipotential generally surrounding the combined system of the conductive object and the conductive coating. It will be appreciated that, for finite gaps between the conductive object and the conductive coating, the electric field may extend partially into the gap between the conductive object and the conductive coating.

Enhancement of the electric field may occur at edges of the conductive coating due to edge effects. This electric field enhancement may induce cold field emission of electrons, which may lead to arcing. The first aspect of the present disclosure is related to reducing the electric field enhancement. Electric field enhancement may be reduced by providing a feature that is proximate to an edge portion of the conductive coating. In particular, the electric field in the vicinity of an edge portion of the conductive coating is reduced relative to the electric field that would result if that feature was not present.

The feature may comprise a profile shape on a surface of the table body. Said profile shape may have a component that lies out of a main plane of the conductive coating, and the edge portion of the conductive coating may be disposed on said profile shape.

Electric field enhancement in the vicinity of an edge of the conductive coating may occur due to the geometry of the system defined by the conductive coating, the conductive object, and any external components that are held at a different electrical potential to that of the conductive coating and the conductive object.

In general, lines of electric equipotential tend to follow the shape of a conductor (electric field lines being perpendicular to the lines of electric equipotential). Any sharp edges of the conductor may result in strong enhancement of the electric field in the vicinity of such sharp edges. As explained above, when the conductive object and the conductive coating are in close proximity to each other and are held at the same potential, the equipotential lines may tend to follow the general shape of the combined system defined by the conductive object and the conductive coating. However, any sharp edges on the conductive coating may still lead to an electric field enhancement. It will be appreciated that, by its nature, a relatively thin conductive coating may have a relatively sharp edge.

The geometry of the system defined by the conductive object and the conductive coating may be modified by introducing a profile shape on a surface of the table body on which the conductive coating is provided. As the conductive coating is a coating, it follows the topology of the surface of the table body on which the conductive coating is provided, including the profile shape. The profile shape may be located such that an edge of the conductive coating is contained within the profile shape. The profile shape may define the geometry of an edge of the conductive coating such that electric field edge effects (and thereby electric field enhancement) in the vicinity of the profile shape are reduced.

There may be a greater distance between the conductive object and the component of the profile shape that lies out of the main plane of the conductive coating than a distance between the conductive object and the main plane of the conductive coating.

The profile shape may comprise a groove.

The groove may comprise a cross-section which is a segment of a circle.

The groove may comprise a cross-section which is generally rectangular with rounded edges.

The profile shape may comprise a curved surface or edge.

In the case where the profile shape is a groove, the groove may comprise one or more curved edges. The cross-section of the groove may be described as a portion of a circle, a portion of a rounded rectangle, or another shape. The conductive coating may follow the surface of the groove. The conductive coating may comprise an end portion that is disposed within the groove.

By following the surface of the groove, the end portion of the conductive coating may be located such that, relative to there being no groove provided, it is at a location where the electric field strength is reduced. Further, curved edges of the groove (leading to a curved end portion of the conductive coating) may modify the electric field in the vicinity of the groove such that concentration of electric field lines, relative to there being no groove provided, is reduced. These effects may reduce electric field enhancement in the vicinity of the edge portion of the conductive coating.

The feature may comprise a groove on a surface of the table body, wherein the edge portion of the conductive coating may be disposed at or near said groove and wherein a conductor may be provided within the groove.

By providing a groove, a larger thickness of conductor may be provided adjacent the edge portion of the conductive coating. Advantageously, the conductor may provide a larger radius of curvature of conducting material at the edge portion of the conductive coating, reducing the electric field strength. The conductor may, for example, be generally cylindrical.

In some embodiments of the present disclosure, the feature may comprise a secondary groove which is provided on a surface of the table body. The secondary groove may be located on the upper surface of the table body. The secondary groove may be described as a deviation from a generally flat upper surface of the table body, similar to the groove described above. The conductive coating may not enter the secondary groove. The secondary groove may be empty.

There may be a difference in electric permittivity between a vacuum or low-pressure gas surrounding the table body and a material from which the table body is formed. Provision of the secondary groove may therefore shape a portion of the electric field between the conductive coating and the conductive object. This may reduce the spatial concentration of electric equipotential lines in the vicinity of an edge portion of the conductive coating, and may reduce electric field enhancement.

In some embodiments of the present disclosure, the feature may comprise an insulating material that covers an intersection between the table body and an edge portion of the conductive coating. The insulating material may substantially cover the entirety of the conductive coating.

An electric triple junction may be defined by the point where a conductor, an insulator, and a medium meet. An insulating material may be provided as a coating to the conductive coating, such that the conductive coating is entirely covered by the insulating material. Such an arrangement of the insulating material may remove all electric triple junctions from the system. This may reduce electric field enhancement at the edges of the conductive coating. Advantageously, the insulating material may also serve to protect the conductive coating from damage during handling and cleaning of the particle beam apparatus. Further, this protection of the conductive coating may prevent sharp features (e.g., from scratches) forming on the conductive coating, which could form a further source for electric field amplification.

In some embodiments of the present disclosure, the insulating material may cover only a portion of the conductive coating. The insulating material may be in contact with one or more intersections between the table body and an edge portion of the conductive coating.

Electric field enhancement (leading to greater probability of cold field emission of electrons) may be pronounced at an electric triple junction. The table body may be formed from an insulator. An electric triple junction may therefore be formed at edges of the conductive coating, where the conductive coating, the table body, and a surrounding medium (e.g., a vacuum) meet.

An electric triple junction at an intersection between the table body and an edge portion of the conductive coating and an environment may be displaced by the insulating material to a region where an electric field strength is lower than an electric field strength in a region of the edge portion of the electric triple junction prior to being displaced.

It will be appreciated that the electric field strength in a region of the edge portion of the electric triple junction prior to being displaced may be intended to mean the electric field strength in a region of the edge portion of the electric triple junction in the absence of the insulating material.

An insulating material may be provided as a coating to the conductive coating, such that the conductive coating is covered by the insulating material only at one or more edges of the conductive coating. Such an arrangement of the insulating material may effectively displace one or more electric triple junctions from one or more edges of the conductive coating to a location that is closer to a central portion of the conductive coating. This may reduce electric field enhancement at the edges of the conductive coating.

The locations on the conductive coating to which the one or more electric triple junctions may have been displaced may correspond to regions where there is low or zero electric field. This may be due to the conductive coating and the conductive object being held at the same electrical potential.

Displacing electric triple junctions to said locations is therefore advantageous as low or zero electric field enhancement may occur at these locations.

In some embodiments of the present disclosure, all intersections between the table body and edge portions of the conductive coating may be covered by the insulating material. The insulating material may have an electrical conductivity such that, in use, a finite (non-zero) current may flow through the insulating material.

In some embodiments, charge may build up on the insulating material. This charge build-up may occur during use of the particle beam apparatus, wherein the conductive coating may be held at a non-zero electrical potential. By forming the insulating material from a substance that has non-zero electrical conductivity, charge build-up may be gradually removed.

The insulating material may have a dielectric constant which is greater than a dielectric constant of the table body.

The particle beam apparatus may be: an electron beam apparatus, a scanning electron microscope, an electron beam direct writer (EBDW), an electron beam projection lithography apparatus, an electron beam inspection apparatus, an electron beam defect verification apparatus, or an electron beam metrology apparatus.

Another aspect of the present disclosure provides an object table for use in the particle beam apparatus according to the first aspect of the disclosure.

Another aspect of the present disclosure provides an object table configured to support an object, comprising: a table body; a first conductive member provided on a surface of the table body; a second conductive member provided on a surface of or within the table body; and a supplementary member having an electrical resistance lower than an electrical resistance of the table body; wherein the supplementary member is disposed on a surface of the table body such that the supplementary member extends between the first conductive member and the second conductive member, and wherein an electrical connection is formed between the supplementary member and each of the first conductive member and the second conductive member.

The object table may form part of a particle beam apparatus, which may form part of, for example, an SEM apparatus. For use in an object table as part of an SEM apparatus, the supplementary member may be a multi-layer mirror or a mirror coating. The supplementary member may occupy only a portion of the surface of the table body on which it is disposed.

The first conductive member may comprise a conductive coating. The first conductive member may be provided on an upper surface of a table body. The second conductive member may comprise a conductive base. The second conductive member may be provided on a lower surface of the table body. Alternatively, the second conductive member may be an electrically conductive member disposed within the table body. Alternatively, the second conductive member may be an electrically conductive surface on which the table body is disposed.

In use, there may be a potential difference between the first conductive member and the second conductive member (for example, a potential difference of the order of 10 kV). As the supplementary member is disposed on a surface of the table body such that the supplementary member extends between the first conductive member and the second conductive member, the inventors have realised that in the absence of an electrical connection formed between the supplementary member and each of the first conductive member and the second conductive member, the lower resistance of the supplementary member relative to the table body may lead to a spatially concentrated drop in electrical potential between the first conductive member and the second conductive member. The spatially concentrated drop of electrical potential may result in electric field enhancement in the vicinity of portions of the surface of the table which are disposed between the first conductive member and the second conductive member, but which are themselves not covered by the supplementary member.

By forming an electrical connection between the supplementary member and each of the first conductive member and the second conductive member, the entire potential difference between the first conductive member and the second conductive member is applied across the supplementary member. As a result, a more uniform gradient of electrical potential may be present across the surface of the table body on which the supplementary member is disposed, resulting in zero or low electric field enhancement.

Electrical contact between the supplementary member and a conductive member may be made generally across a whole edge of the conductive member and/or the supplementary member. Alternatively, electrical contact between the supplementary member and a conductive member may be made only at one or more portions of an edge of the conductive member and/or the supplementary member. Advantageously, forming an electrical connection between the supplementary member and a conductive member across a whole edge of the conductive member and/or the supplementary member may result in good electrical connection between the conductive member and the supplementary member. Further, such an arrangement may result in a drop of electrical potential across the surface of the table body on which the supplementary member is disposed which is not spatially concentrated, leading to zero or low electric field enhancement.

The electrical connection between the supplementary member and each of the two conductive members may be formed by direct contact between one or more of the conductive members and the supplementary member. In some embodiments, the electrical connection between the supplementary member and each of the two conductive members may be formed via the provision of a separate conducting portion.

The object table may be suitable for use in: an electron beam apparatus, a scanning electron microscope, an electron beam direct writer, an electron beam projection lithography apparatus, an electron beam inspection apparatus, an electron beam defect verification apparatus, or an electron beam metrology apparatus.

The first conductive member may be provided as a coating on the table body.

The second conductive member may be provided as a coating on the table body.

The supplementary member may be a mirror provided on a surface of the table body or may be provided as a mirror coating on the table body.

BRIEF DESCRIPTION OF THE DRAWINGS

Embodiments of the present disclosure will now be described, by way of example, with reference to the accompanying drawings.

DETAILED DESCRIPTION

Figure 1A:
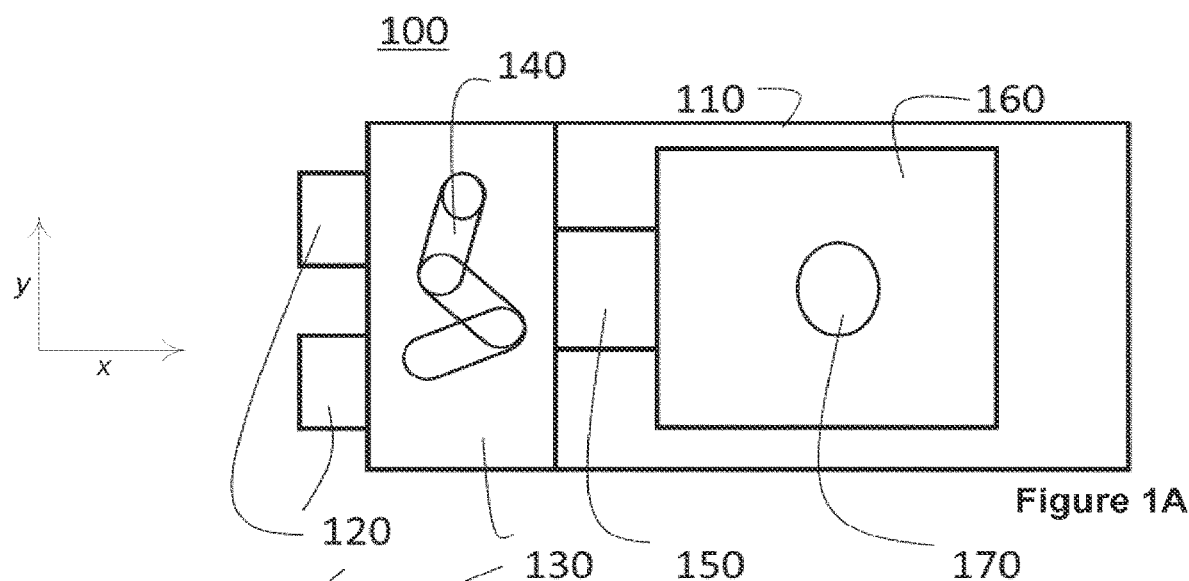
FIGS. 1A and 1B are schematic illustrations of an e-beam inspection tool according to some embodiments of the present disclosure.

Various example embodiments of the present disclosure will now be described more fully with reference to the accompanying drawings in which some example embodiments of the disclosure are shown. In the drawings, the thicknesses of layers and regions may be exaggerated for clarity.

Detailed illustrative embodiments of the present disclosure are disclosed herein. However, specific structural and functional details disclosed herein are merely representative for purposes of describing example embodiments of the present disclosure. This disclosure may, however, be embodied in many alternate forms and should not be construed as limited to only the embodiments set forth herein.

Accordingly, while example embodiments of the disclosure are capable of various modifications and alternative forms, embodiments thereof are shown by way of example in the drawings and will herein be described in detail. It should be understood, however, that there is no intent to limit example embodiments of the disclosure to the particular forms disclosed, but on the contrary, example embodiments of the disclosure are to cover all modifications, equivalents, and alternatives falling within the scope of the disclosure. Like numbers refer to like elements throughout the description of the figures.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

The term "substrate" may be a wafer or a glass substrate, and the term "patterning device" may be a "reticle", which may also be referred to as a "mask".

In this disclosure, "axial" means "in the optical axis direction of an apparatus, column or a device such as a lens", while "radial" means "in a direction perpendicular to the optical axis". Usually, the optical axis starts from the cathode and ends at specimen. The optical axis refers to z-axis in all drawings.

The term, "crossover", refers to a point where the electron beam is focused.

The term, "virtual source", means the electron beam emitted from the cathode may be traced back to a "virtual" source.

The "inspection tool" according to the present disclosure relates to a charged particle source, especially to an e-beam source which may be applied to a SEM apparatus, an e-beam inspection tool, or an EBDW. The e-beam source, in this art, may also be referred to as an e-gun or an electron gun.

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and some differences with respect to the individual embodiments are described.

Accordingly, while example embodiments of the disclosure are capable of various modifications and alternative forms, embodiments thereof are shown by way of example in the drawings and will herein be described in detail. It should be understood, however, that there is no intent to limit example embodiments of the disclosure to the particular forms disclosed, but on the contrary, example embodiments of the disclosure are to cover all modifications, equivalents, and alternatives falling within the scope of the disclosure.

Figure 1B:
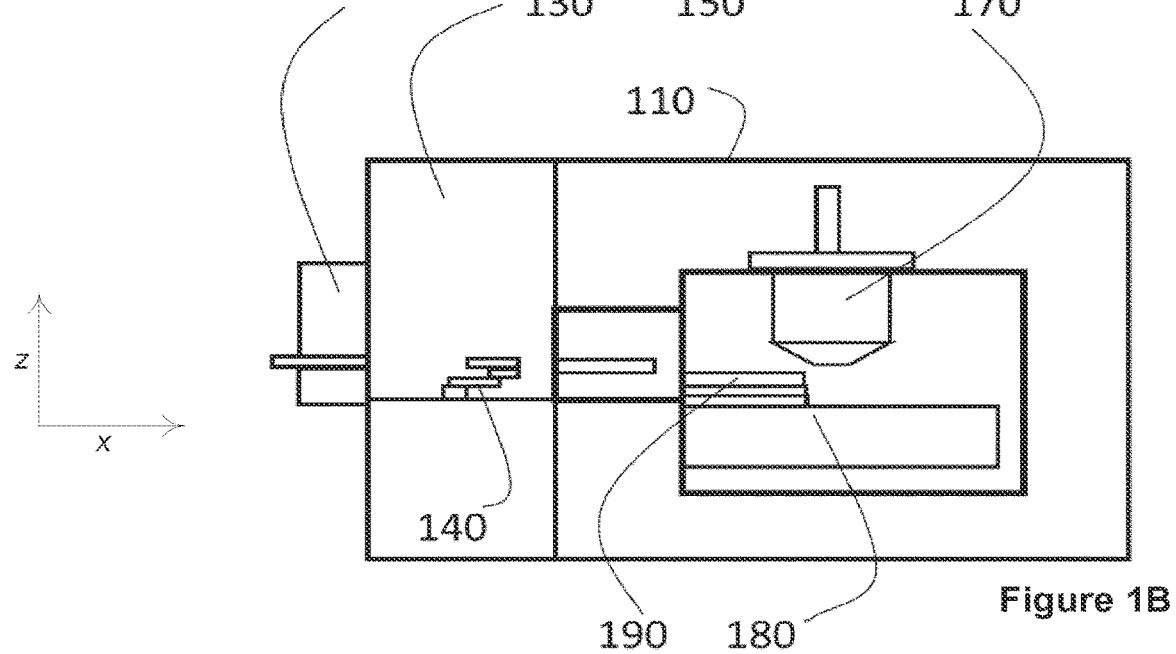

FIGS. 1A and 1B schematically depict a top view (1A) and a cross-sectional view (1B) of an electron beam (e-beam) inspection (EBI) system 100, according to some embodiments of the present disclosure. The embodiment shown in FIG. 1A comprises an enclosure 110, and a pair of load ports 120 serving as an interface to receive objects to be examined and to output objects that have been examined. EBI system 100 further comprises an object transfer system, referred as an EFEM, equipment front end module 130, which is configured to handle and/or transport the objects to and from the load ports. EFEM 130 comprises a handler robot 140 configured to transport objects between the load ports and a load lock 150 of EBI system 100. Load lock 150 is an interface between atmospheric conditions occurring outside the enclosure 110 and in the EFEM 130 and the vacuum conditions occurring in a vacuum chamber 160 of the EBI system 100. Vacuum chamber 160 comprises an electron optics system 170 configured to project an e-beam onto an object to be inspected, e.g. a semiconductor substrate or wafer. The EBI system 100 further comprises a positioning device 180 that is configured to displace the object 190 relative to the e-beam generated by the electron optics system 170. In some embodiments, positioning device 180 is at least partly arranged within vacuum chamber 160.

In some embodiments, the positioning device 180 may comprise a cascaded arrangement of multiple positioners such as an xy-stage for positioning the object in a substantially horizontal (x-y) plane, and a z-stage for positioning the object in the vertical (z) direction.

In some embodiments, the positioning device may comprise a combination of a coarse positioner, configured to provide a coarse positioning of the object over comparatively large distances and a fine positioner, configured to provide a fine positioning of the object over comparatively small distances.

In some embodiments, the positioning device 180 further comprises an object table for holding object 190 during the inspection process performed by the EBI system 100. In such a configuration, object 190 may be clamped onto the object table by means of a clamp such as an electrostatic clamp or vacuum clamp. Such a clamp may be integrated in the object table.

In accordance with the present disclosure, the positioning device 180 comprises a first positioner for positioning the object table and a second positioner for positioning the first positioner and the object table.

In some embodiments, vacuum chamber 160 comprises an electromagnetic shield to shield off external electromagnetic influences. Such an electromagnetic shield may also be referred to as an EMI (electromagnetic interference) shield. In some embodiments, the electromagnetic shield may be configured to shield a detector of the EBI system 100 from external influences.

Figure 2A:
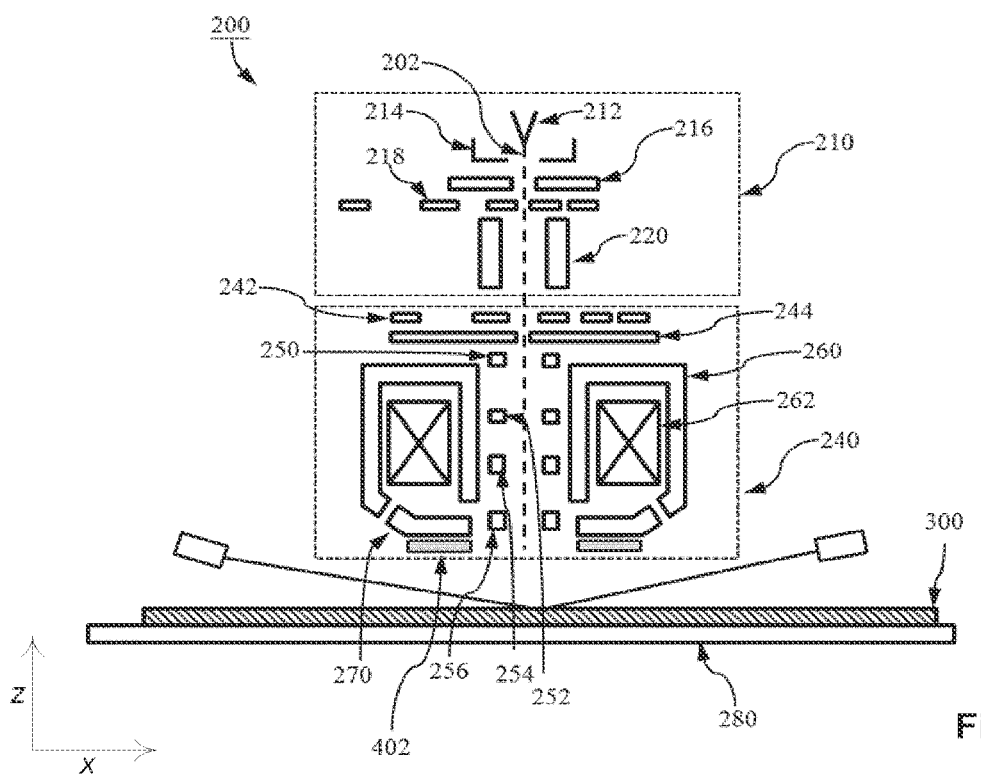
FIGS. 2A and 2B are schematic illustrations of an electron optical system as may be applied in some embodiments of the present disclosure FIG. 3 schematically depicts an exemplary control architecture of an EBI system according to some embodiments of the present disclosure.

FIG. 2A schematically depicts an exemplary electron optics system 200 as may be applied in e-beam inspection tool or system according to the present disclosure. The electron optics system 200 comprises an e-beam source, referred to as an electron gun 210, and an imaging system 240.

In some embodiments, electron gun 210 may comprise an electron source 212, a suppressor 214, an anode 216, a set of apertures 218, and a condenser lens 220. The electron source 212 may be a Schottky emitter. More specifically, the electron source 212 may include a ceramic substrate, two electrodes, a tungsten filament, and a tungsten pin. The two electrodes may be fixed in parallel to the ceramic substrate, and the other sides of the two electrodes may, respectively, be connected to two ends of the tungsten filament. The tungsten may be slightly bended to form a tip for placing the tungsten pin. A Zirconia ($ZrO_2$) coating may be provided on the surface of the tungsten pin, and may be heated to 1500° C. so as to be melted and cover the tungsten pin but uncover the pinpoint of the tungsten pin. The melted $ZrO_2$ may decrease the work function of the tungsten and decrease the energy barrier of the emitted electron, and thus an electron beam 202 may be emitted efficiently. Then, by applying negative electricity to suppressor 214, electron beam 202 may be suppressed. Accordingly, the electron beam having the large spread angle is suppressed to the primary electron beam 202, and thus the brightness of the electron beam 202 is enhanced. By the positive charge of anode 216, electron beam 202 may be extracted, and then the Coulomb's compulsive force of the electron beam 202 may be controlled by using the tuneable aperture 218 which has different aperture sizes for eliminating the unnecessary electron beam outside of the aperture 218. In order to condense electron beam 202, the condenser lens 220 may be applied to the electron beam 202, which may also provide magnification. The condenser lens 220 shown in FIG. 2 may, for example, be an electrostatic lens which condenses the electron beam 202. Alternatively, the condenser lens 220 may be also a magnetic lens.

Figure 2B:
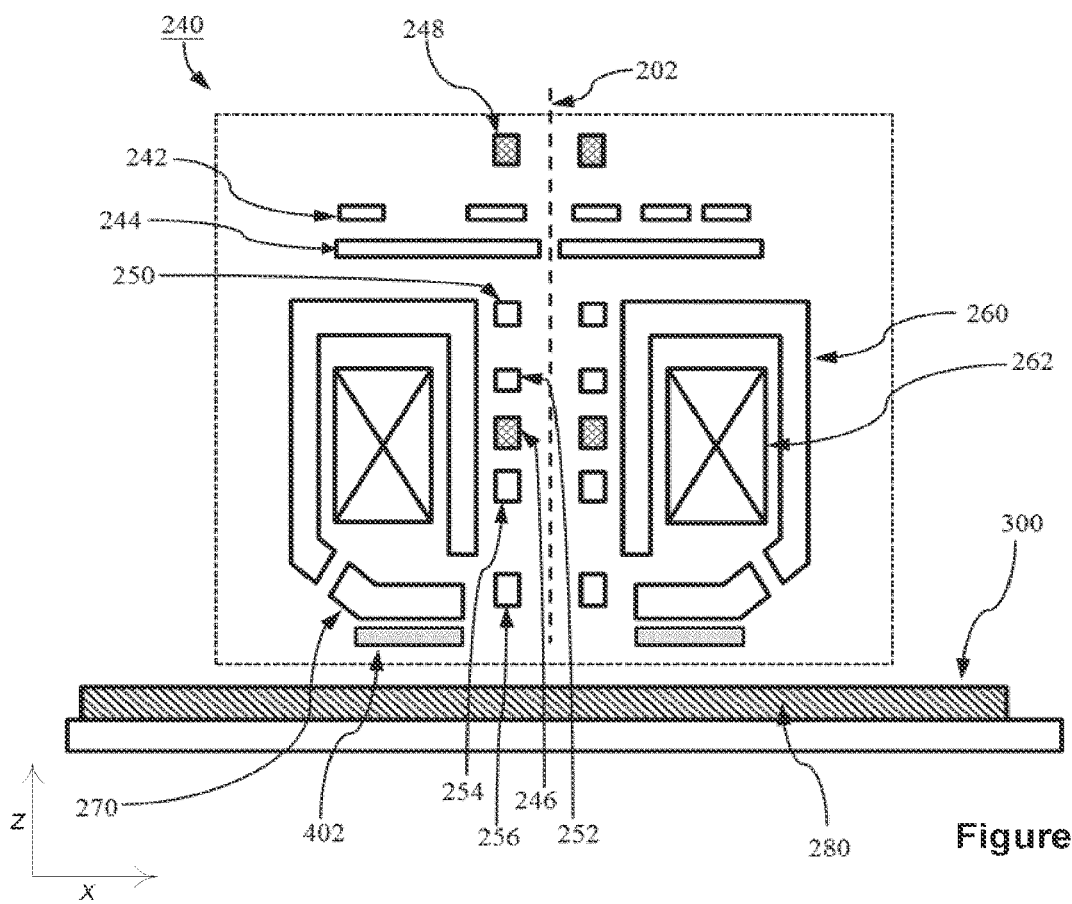

The imaging system 240 as shown in FIG. 2B comprises a blanker 248, a set of apertures 242, a detector 244, four sets of deflectors 250, 252, 254, 256, a pair of coils 262, a yoke 260, a filter 246, and an electrode 270. The electrode 270 is used to retard and deflect the electron beam 202, and further has electrostatic lens function due to the combination of upper pole piece and sample 300. The coil 262 and the yoke 260 are configured to the magnetic objective lens.

The electron beam 202, described above, is generated by heating the electron pin and applying the electric field to anode 216. It may be desirable for the electron pin to be heated for a sufficiently long time to stabilize the electron beam 202. For a user end, this may be time consuming and inconvenient. Hence, the blanker 248 is applied to the condensed electron beam 202 for temporally deflecting the electron beam 202 away from the sample rather than turning off it.

The deflectors 250, 256 are applied to scan the electron beam 202 to a large field of view, and the deflectors 252, 254 are used for scanning the electron beam 202 to a small field of view. All the deflectors 250, 252, 254, 256 may control the scanning direction of the electron beam 202. The deflectors 250, 252, 254, 256 may be electrostatic deflectors or magnetic deflectors. The opening of the yoke 260 is faced to the sample 300, which immerses the magnetic field into the sample 300. The electrode 270 is placed beneath the opening of the yoke 260, and therefore the sample 300 may not be damaged. In order to correct chromatic aberration of the electron beam 202, the retarder 270, the sample 300, and the upper pole piece form a lens to reduce the chromatic aberration of the electron beam 202.

When the electron beam 202 bombards into the sample 300, a secondary electron may be emanated from the surface of the sample 300. Next, the secondary electron may be directed to the detector 244 by filter 246.

FIG. 3 schematically depicts an exemplary control architecture of an EBI system 300, according to some embodiments of the present disclosure. As indicated in FIG. 1, the EBI system 100 comprises a load port 120, an object transfer system 130, a load/lock 150, an electron optics system 170 and a positioning device 180. The positioning device 180 includes a z-stage 302 and an xy-stage 305. As illustrated, these various components of the EBI system may be equipped with respective controllers, such as an object transfer system controller 310 connected to the object transfer system 130, a load/lock controller 315, a stage controller 330, a detector controller 320 (for control of detector 244) and an electron optics controller 325. These controllers may be communicatively connected to a system controller computer 335 and an image processing computer 340, e.g. via a communication bus 345. In FIG. 3 as shown, a system controller computer 335 and the image processing computer 340 may be connected to a workstation 350.

The load port 120 loads an object 190 (e.g., a wafer) to the object transfer system 130, and the object transfer system controller 310 controls the object transfer system 130 to transfer the object 190 to the load/lock 150. The load/lock controller 315 controls the load/lock 150 to the chamber 160, such that an object 190 that is to be examined may be fixed on a clamp 355, e.g. an electrostatic clamp, also referred to as an e-chuck. The positioning device, e.g. the z-stage 302 and the xy-stage 305, enable the object 190 to move under control of the stage controller 330. In an embodiment, a height of the z-stage 302 may be adjusted using a piezo component such as a piezo actuator. The electron optic controller 325 may control all the conditions of the electron optics system 170, and the detector controller 320 may receive and convert the electric signals from the electron optic system (detector 244) into image signals. The system controller computer 335 is operable to send the commands to the corresponding controller. After receiving the image signals, the image processing computer 340 may process the image signals to identify defects.

Embodiments of the present disclosure, described in detail below, relate to the positioning device 180 shown in FIG. 1. In particular, embodiments of the present disclosure relate to the object table, described above.

Figure 4:
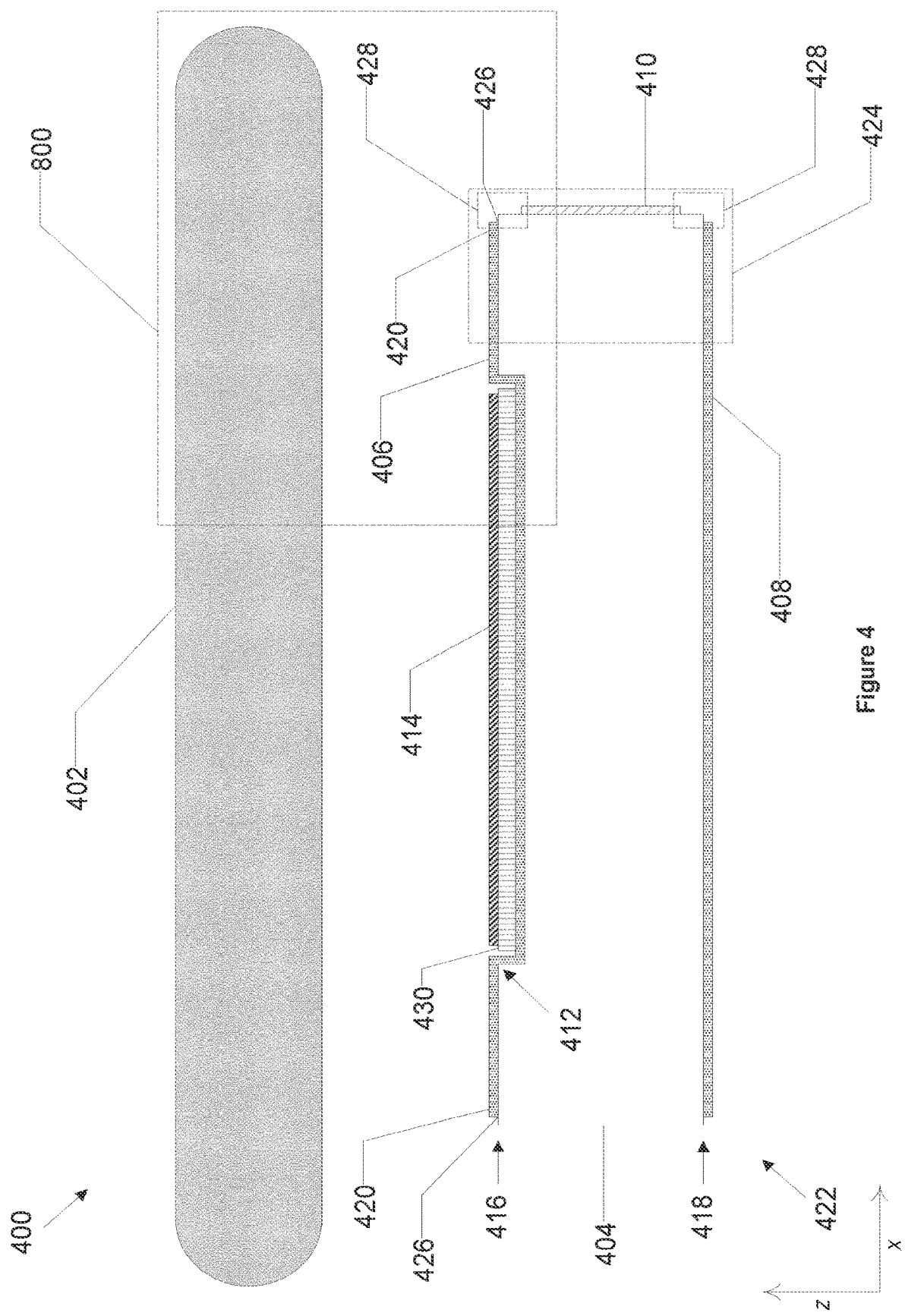
FIG. 4 schematically depicts an exemplary particle beam apparatus and a substrate, according to some embodiments of the present disclosure.

FIG. 4 shows a cross-section through part of a particle beam apparatus 400, comprising: a conductive object 402; a table body 404; a conductive coating 406; a conductive base 408; and a supplementary member 410. The particle beam apparatus 400 may be generally of the form of the EBI system 100 shown in in FIG. 1. The conductive object 402 is also shown in FIGS. 2A and 2B.

The table body 404 may be cuboidal. Two of the dimensions of the table body are substantially equal in size. The third dimension of the table body may be smaller than the other two dimensions. The shape of the table body 404 may be described as planar. As such, two opposite surfaces of the table body 404 may be square shaped, and constitute an upper surface 416 and a lower surface 418. The table body 404 may be formed from an electrical insulator. The upper surface 416 of the table body 404 comprises a recess 412. The recess 412 may be circular. The conductive coating 406 and the conductive base 408 are electrical conductors. The conductive coating 406 and the conductive base 408 are provided on a portion of the upper surface 416 and a portion of the lower surface 418 of the table body 404, respectively. The supplementary member 410 is disposed on a surface of the table body 404 between the conductive coating 406 and the conductive base 408. The table body 404, conductive coating 406, conductive base 408, and supplementary member 410 constitute an object table 422. The object table 422 may correspond to the object table that forms part of the positioning device 180 shown in FIG. 1.

In some embodiments, particle beam apparatus 400 described above may not include the conductive base 408. Rather, the lower surface 418 of the table body 404 may rest directly or indirectly on a conductive surface. Providing a conductive base 408 on a portion of the lower surface 418 of the table body 404 may allow surface electric charge to transfer from components to the conductive base 408. Advantageously, this may allow charge drainage which may prevent build-up of electric charge on the lower surface 418 of the table body 404.

In some embodiments, the conductive object 402 may have rounded edges. The shape of the conductive object 402 may be planar. The conductive object 402 and the table body 404 are disposed within a vacuum chamber (not shown), the table body 404 being proximate to the conductive object 402. Such a vacuum chamber may correspond to the vacuum chamber 160 shown in FIG. 1. The table body 404 is arranged such that the upper surface 416 of the table body 404 faces the conductive object 402. The upper surface 416 of the table body 404 is substantially parallel to the conductive object 402. The conductive object 402 may be fixed to a wall of the vacuum chamber. The conductive object 402 may be arranged such that the position of the conductive object 402 relative to the vacuum chamber is fixed. The table body 404 is moveable relative to the electron optics system 200. It will be appreciated that, for simplicity, the vacuum chamber and any other surrounding components have been omitted from FIG. 4.

In use, a substrate 414 may be held by a chuck 430 disposed on the conductive coating 406 within the recess 412, and an electron beam may be incident on the substrate 414. The chuck 430 may comprise an arrangement of electrodes. The arrangement of electrodes in the chuck 430 may be operable to clamp the substrate 414 in position by electrostatic attraction. The chuck 430 may be described as an electrostatic clamp. Additionally, or alternatively, the chuck 430 may comprise a vacuum clamp. The electron beam may be generated and controlled using a scanning electron microscope apparatus of the type described above with reference to FIGS. 1 to 3. The electron beam may be generated on the opposite side of the conductive object 402 to which the table body 404 is disposed. The conductive object 402 may comprise an aperture to allow the electron beam to be incident on the substrate 414. This may be useful for imaging the substrate 414 using the electron beam.

In some embodiments, the conductive object 402 may be held at a negative electrical potential of the order of −1 kV, −10 kV, or lower. This may decelerate electrons in the electron beam before they are incident on the substrate 414. This may be useful to prevent damage to the substrate 414 from the incoming electron beam. Further, holding the conductive object 402 at this negative electric potential may be used to accelerate secondary electrons and backscattered electrons towards a detector when the conductive object 402 is used as part of a SEM apparatus.

The conductive coating 406 may be held at a substantially equivalent electrical potential to the electrical potential of the conductive object 402. This may be useful to reduce an electric field strength between the conductive coating 406 and the conductive object 402 (i.e., in the vicinity of the substrate 414 when supported on the surface of the table body 404 on which the conductive coating 406 is provided). Reducing an electric field strength in the vicinity of the substrate 414 may reduce the effect of such an electric field on measurements made by the electron beam as part of the scanning electron microscope apparatus.

The table body 404, on which the substrate 414 is disposed, may be displaced relative to the conductive object 402 and electron beam. This may enable different portions of the substrate 414 to be inspected by the electron beam. The supplementary member 410 may be a mirror, such as a multi-layer mirror. The multi-layer mirror may be useful for measuring a current position of the table body 404 using, for example, an interferometer.

In some embodiments, the supplemental member 410 may be a mirror coating.

The materials for the conductive coating 406 and/or the mirror coating may be selected such that the emissivity of the coatings have a preferable value. For example, the current position of the table body 404 may be measured using an interferometer at the mirror coating of the table body 404. Temperature variations of the table body 404 may result in measurement errors of the current position of the table body 404 due to the thermal deformation of the table body 404. Choosing a material with low emissivity for the conductive coating 406 and/or the mirror coating increases the reflectivity of the conductive coating and/or the mirror coating. The conductive coating 406 and/or the mirror coating with a low emissivity reflects radiation incident on the coatings from the surrounding and reduces temperature increase of the table body 404 due to absorption of the radiation. Examples of the material with low emissivity may include, but are not limited to, chrome, titanium, or titanium nitride.

In some embodiments, a conductive plate may be provided on the upper surface 416 of the table body 404 instead of the conductive coating 406. In use, the conductive plate may be held at a substantially equivalent electrical potential to the electrical potential of the conductive object 402. This may be useful to reduce an electric field strength in the vicinity of a substrate 414 disposed within the recess 412, as discussed above. However, the conductive plate may cover only a peripheral portion of the upper surface 416 of the table body 404 and may not extend into the recess 412. Advantageously, the conductive coating 406 does extend into the recess 412 (underneath where the substrate 414 is disposed), as illustrated in FIG. 4. As a result, by using a conductive coating 406, the electric field strength in the vicinity of the substrate 414 disposed within the recess 412 may be better reduced compared with using a conductive plate. The conductive coating 406 weighs less than a conductive plate. This reduction in weight is beneficial, as the table body 404 is a moving component. Further, as the conductive coating 406 is a coating (and not a separate component, like the conductive plate), dynamic properties of the object table 422 are improved. This may lead to a reduction in errors in positioning the substrate 414 relative to the incident electron beam.

The conductive base 408 may be held at a different electrical potential to the electrical potential of the conductive coating 406 and the conductive object 402. Surrounding components, such as the vacuum chamber, may be held at a different electrical potential to the electrical potential of the conductive coating 406 and the conductive object 402. The conductive base 408 may be held at 0 V. Surrounding components, such as the vacuum chamber, may be held at 0 V. An electric field may therefore exist between parts of the particle beam apparatus 400 (the conductive coating 406 and the conductive object 402) and surrounding components, such as the vacuum chamber and/or the conductive base 408.

Properties of the particle beam apparatus 400 as described above may lead to localised enhancement of said electric field in the vicinity of one or more sections of the table body 404. Localised electric field enhancement may increase the likelihood of cold field emission of electrons within the particle beam apparatus 400. This may lead to arcing within the particle beam apparatus 400, which is undesirable. Embodiments of the present disclosure comprise arrangements generally of the form of the part of the particle beam apparatus 400 shown in FIG. 4, and which are arranged so as to reduce this electric field enhancement.

In some embodiments, electric field enhancement may be reduced by providing the table body 404 with a feature proximate to an edge portion 420 of the conductive coating 406, said feature being arranged so as to reduce an electric field strength in the vicinity of the edge portion 420 when a voltage is applied to both the conductive object 402 and the conductive coating 406. Examples of such embodiments are shown in FIGS. 5 to 14. In some embodiments, electric field enhancement may be reduced by providing a feature that is proximate to an edge portion 420 of the conductive coating 406. In particular, the electric field in the vicinity of an edge portion 420 of the conductive coating 406 may be reduced relative to the electric field that would result if that feature was not present.

Specifically, some embodiments of the present disclosure may reduce said electric field enhancement by providing the table body 404 with a feature proximate to an edge portion 420 of the conductive coating 406, wherein the feature comprises a profile shape on the upper surface 416 of the table body 404 on which the conductive coating 406 is provided, and wherein said profile shape has a component that lies out of a main plane of the conductive coating 406, and wherein the edge portion 420 of the conductive coating 406 is disposed on said profile shape. It will be appreciated that the main plane of the conductive coating 406 is the x-y plane (i.e., a plane perpendicular to the z-direction) described above with reference to FIGS. 1 and 2. It will be appreciated that the main plane may be a plane which is substantially parallel to the upper surface 416 of the table body 404 on which a substrate 414 may be held.

A particle beam apparatus 500 according to some embodiments of the disclosure is now described with reference to FIGS. 5, 6, and 7.

Figure 5:
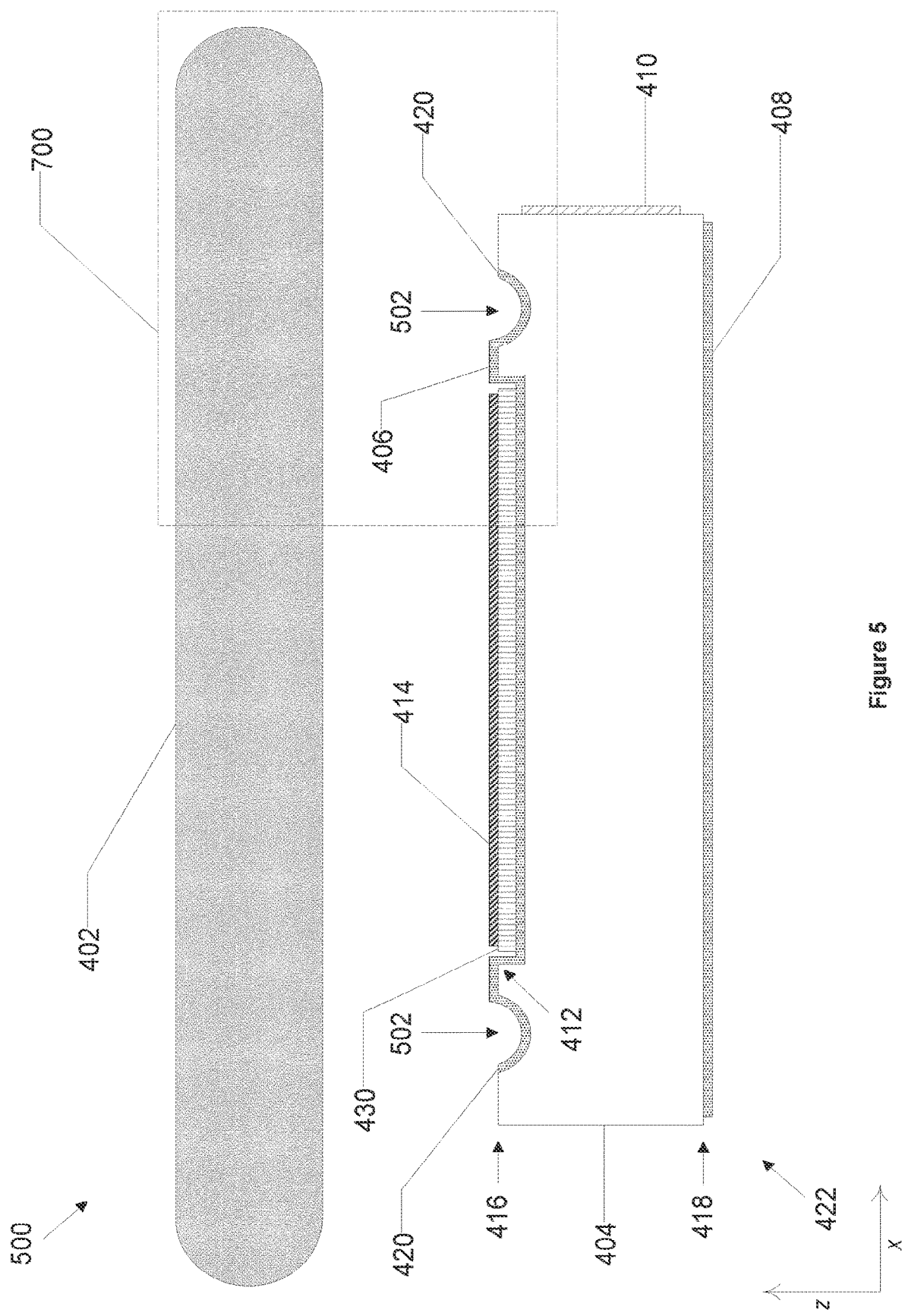
FIG. 5 schematically depicts an exemplary particle beam apparatus and a substrate, according to some embodiments of the present disclosure.

The particle beam apparatus 500 shown in FIG. 5 shares several features in common with the particle beam apparatus 400 shown in FIG. 4. Some differences between the particle beam apparatus 500 and the particle beam apparatus 400 are described. Any features of the particle beam apparatus 500 shown in FIG. 5 which generally correspond to, and may be generally the same as, features of the particle beam apparatus 400 shown in FIG. 4 (or features of any other figure) share common reference numerals therewith.

FIG. 5 shows a cross-section through part of a particle beam apparatus 500 according to some embodiments of the present disclosure. In addition to components of the particle beam apparatus 400 of FIG. 4, the particle beam apparatus 500 may comprise a groove 502. FIG. 6 shows a plan view of the same part of the particle beam apparatus 500 showing the upper surface 416 of the table body 404 but with the conductive object 402 not shown, for clarity. The plane of the cross-section shown in FIG. 5 is labelled 602 in FIG. 6.

In some embodiments, the groove 502 may be located on the upper surface 416 of the table body 404. The groove 502 may be described as a deviation from a generally flat upper surface 416 of the table body 404. The groove 502 may be described as a profile shape. The groove 502 is located between outer edges of the upper surface 416 of the table body 404 and the recess 412. The groove 502 may form a continuous channel that surrounds the conductive coating 406 (see FIG. 6). The groove 502 may be circular in cross-section (see FIG. 5).

In comparison to the particle beam apparatus 400 shown in FIG. 4, the geometry of the system defined by the conductive object 402 and the conductive coating 406 is modified in the particle beam apparatus 500 according to some embodiments of the disclosure by introducing the groove 502 on the upper surface 416 of the table body 404 on which the conductive coating 406 is provided. As the conductive coating 406 is a coating, it follows the topology of the upper surface 416 of the table body 404, including the groove 502. The groove 502 is located such that the edge portion 420 of the conductive coating 406 is contained within the groove 502. The groove 502 defines the geometry of the edge portion 420 of the conductive coating 406 such that electric field edge effects (and thereby electric field enhancement) in the vicinity of the groove 502 are reduced. Electric field edge effects may be reduced when the edge portion 420 of the conductive coating 406 is arranged so as to be substantially parallel to electric equipotential lines.

An electric equipotential line shows regions in space where every point along the line has the same electric potential. Mutually adjacent electric equipotential lines illustrate a difference in electric potential of a fixed magnitude. Said fixed magnitude may be described as an equipotential plotting resolution. Electric field strength is represented by the spatial proximity of electric equipotential lines; lines plotted close to each other represent a relatively high electric field strength, and vice-versa. Electric equipotential lines may be referred to simply as "equipotential lines".

Figure 6:
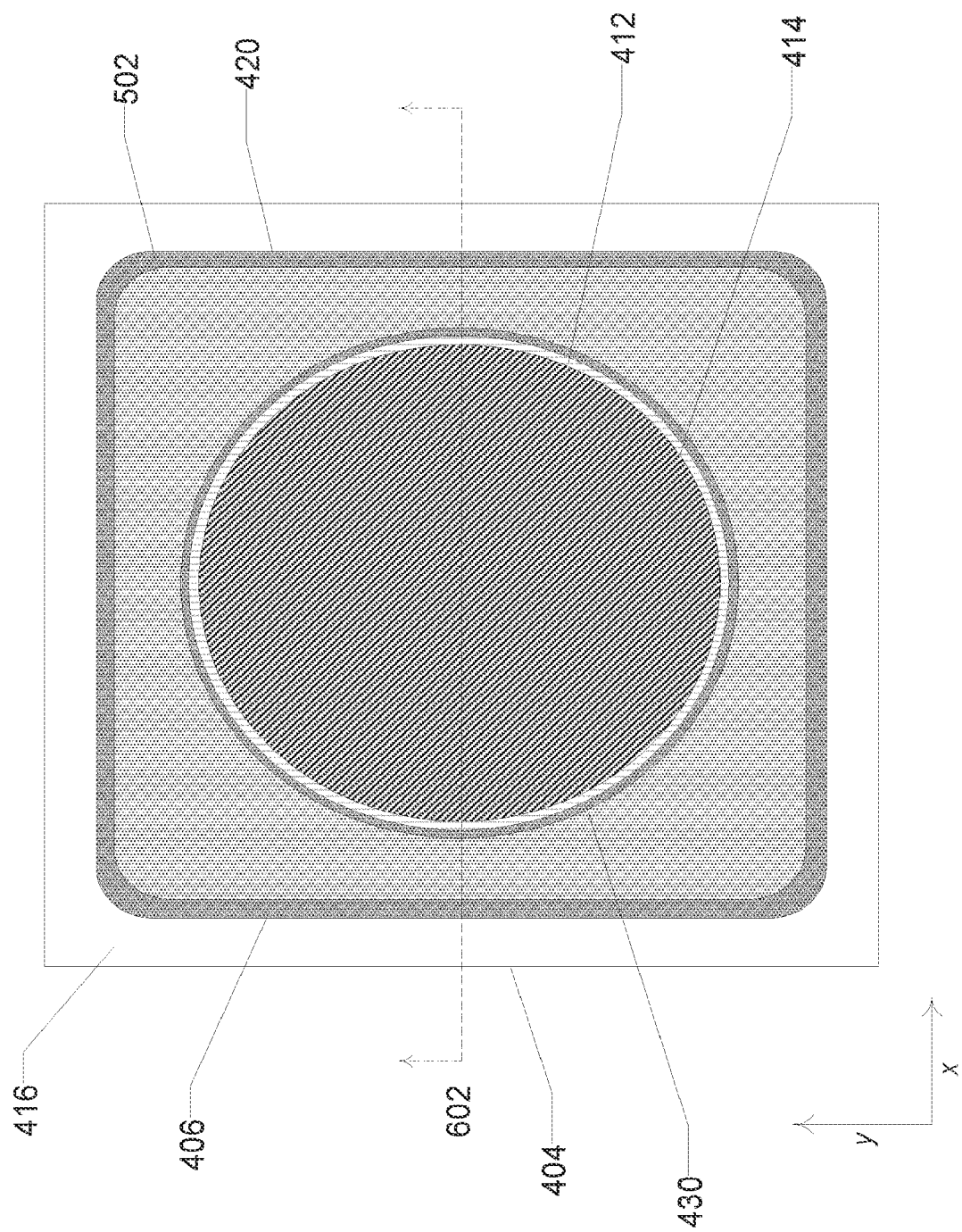
FIG. 6 schematically depicts an alternative view of a part of the particle beam apparatus and substrate shown in FIG. 5, according to some embodiments of the present disclosure.

A separation between components of the particle beam apparatus 500 shown in FIGS. 5 and 6 and surrounding components may be significantly larger than a separation between the conductive coating 406 and the conductive object 402. For a sufficiently small gap between the conductive object 402 and the conductive coating 406, an electric field in the vicinity of the particle beam apparatus 500 is similar to the electric field that would exist if the conductive object 402 and conductive coating 406 were a single conductor, with electric equipotential lines generally surrounding the combined system of the conductive object 402 and the conductive coating 406, as shown in FIG. 7. For finite gaps between the conductive object 402 and the conductive coating 406, the electric field may extend partially into the gap between the conductive object 402 and the conductive coating 406, also shown in FIG. 7.

In some embodiments, electric field enhancement in the vicinity of an edge portion 420 of the conductive coating 406 may occur due to the geometry of the system defined by the conductive coating 406, the conductive object 402, and surrounding components of the particle beam apparatus 500 that are held at a different electrical potential to that of the conductive coating 406 and the conductive object 402. Any sharp edges of the conductive coating 406 may result in strong enhancement of the electric field in the vicinity of such sharp edges. As explained above, when the conductive object 402 and the conductive coating 406 are in close proximity to each other and are held at the same potential, the equipotential lines may tend to follow the general shape of the combined system defined by the conductive object 402 and the conductive coating 406. However, any sharp edges on the conductive coating 406 may still lead to an electric field enhancement. It will be appreciated that, by its nature, a relatively thin conductive coating 406 will have a relatively sharp edge.

Figure 7:
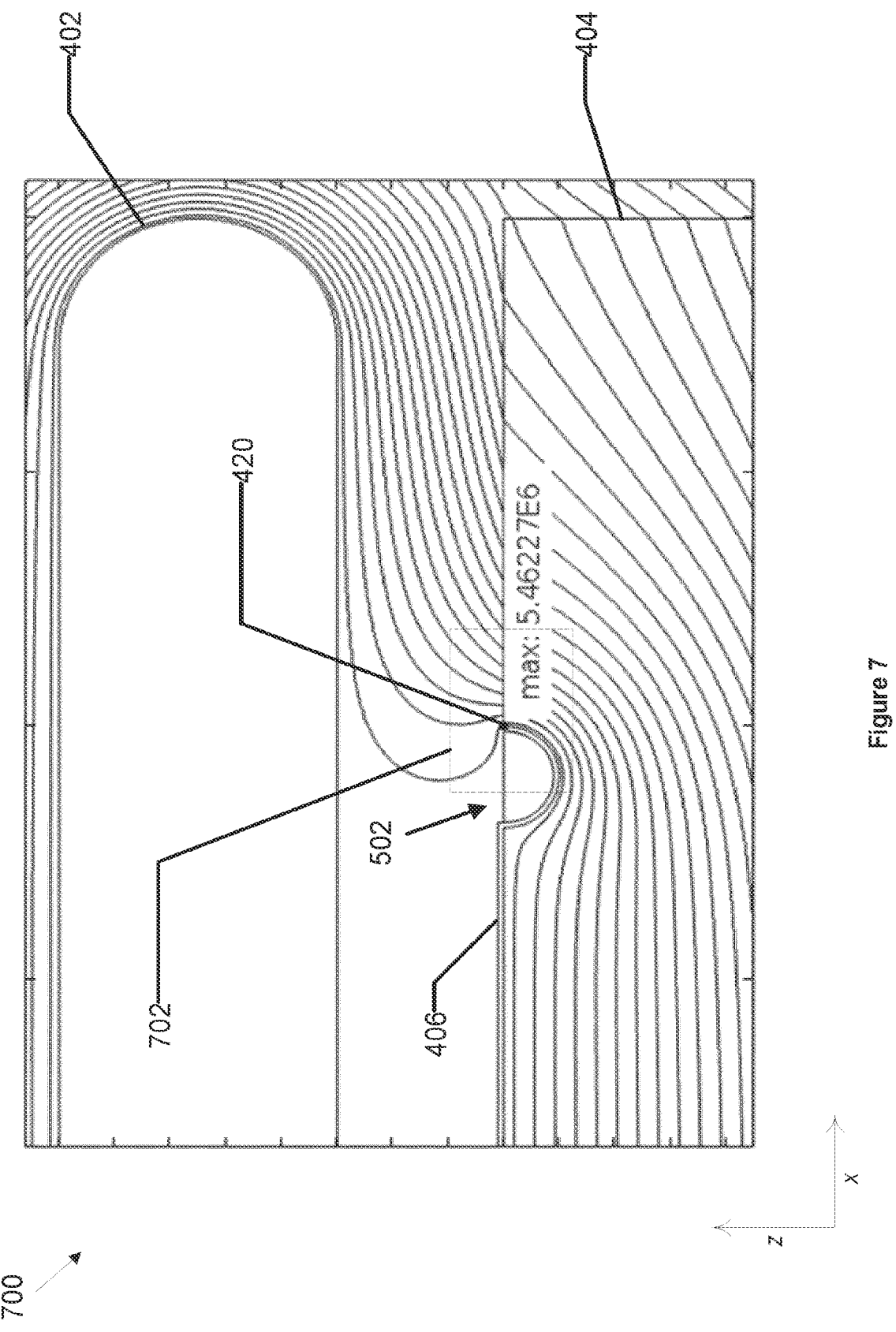
FIG. 7 illustrates a plot of electric equipotential lines corresponding to the part of the particle beam apparatus shown in FIG. 5, according to some embodiments of the present disclosure.

FIG. 7 shows a plot of electric equipotential lines in a portion 700 of the part of the particle beam apparatus 500 shown in FIG. 5, when the conductive object 402 and the conductive coating 406 are held at a negative potential (such as −1 kV, −10 kV, or lower) and surrounding components, i.e., the conductive base 408 and the vacuum chamber (not shown), are held at a relatively positive potential (such as 0 V). Proximate to the conductive coating 406, equipotential lines generally follow the contour of the conductive coating 406, including the portion of the conductive coating 406 disposed within the groove 502. At the equipotential plotting resolution shown in FIG. 7, there are no equipotential lines present between an inner, central portion of the conductive coating 406 and the conductive object 402. This illustrates that the electric field strength between the inner, central portion of the conductive coating 406 and the conductive object 402 is much smaller in this region than in other regions. Equipotential lines between the portion of the table body 404 that is not coated by the conductive coating 406 and the conductive object 402 generally curve to follow the contour of the conductive object 402. In the vicinity 702 of the edge portion 420 of the conductive coating 406, equipotential lines partially wrap around the edge portion 420 of the conductive coating 406. Equipotential lines are spatially concentrated in this vicinity 702. The highest electric field strength in the vicinity 702 of the edge portion 420 of the conductive coating 406, using the particle beam apparatus 500 is $5.5 \times 10^6$ V m$^{-1}$.

Theoretically, electric field strength at an edge may approach infinity (in the absence of surface charge and in the case of an infinitely thin coating or perfectly sharp edges). However, it will be appreciated that, for the purposes of simulation, relevant calculation parameters may be chosen which enable an estimation of electric field strength for different embodiments of particle beam apparatus. Therefore, whilst numerical values of electric field strength may be only illustrative, they provide a valid method of comparing electric field strength reduction effects in different embodiments of particle beam apparatus.

Figure 8:
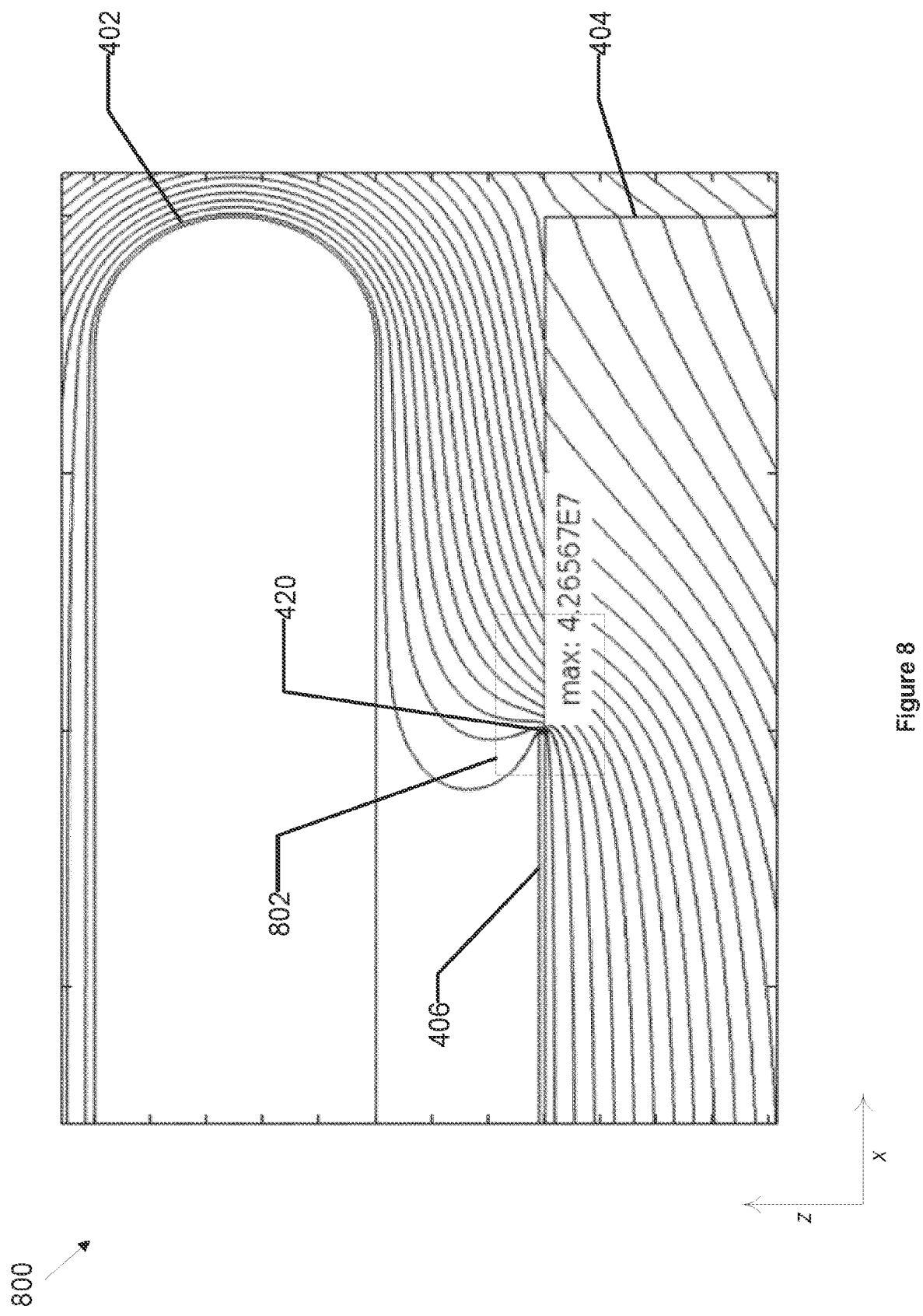
FIG. 8 illustrates a plot of electric equipotential lines corresponding to the part of the particle beam apparatus shown in FIG. 4, according to some embodiments of the present disclosure.

FIG. 8 shows a plot of electric equipotential lines in a portion 800 of the part of the particle beam apparatus 400 shown in FIG. 4, when the conductive object 402 and the conductive coating 406 are held at a negative potential (such as −1 kV, −10 kV, or lower) and surrounding components, i.e., the conductive base 408 and the vacuum chamber (not shown), are held at a relatively positive (such as 0 V). In the vicinity 802 of the edge portion 420 of the conductive coating 406, equipotential lines wrap significantly around the edge portion 420 of the conductive coating 406. Equipotential lines are highly spatially concentrated in this vicinity 802. The highest electric field strength in the vicinity 802 of the edge portion 420 of the conductive coating 406, using the particle beam apparatus 400, is $4.3 \times 10^7$ V m$^{-1}$.

Advantageously, as may be seen from FIGS. 7 and 8, by providing a groove 502 that the conductive coating 406 follows and in which the edge portion 420 of the conductive coating 406 is disposed, the electric field strength in the vicinity of the edge portion 420 of the conductive coating 406 is reduced (see FIG. 7) relative to the electric field strength that would exist if no groove 502 is provided (see FIG. 8).

Using the particle beam apparatus 500 according to some embodiments of the present disclosure, shown in FIG. 5, the edge portion 420 is at a location where the electric field strength is reduced relative to the particle beam apparatus 400 shown in FIG. 4. Further, using the particle beam apparatus 500 according to the first embodiment of the present disclosure, curved edges of the groove 502 (leading to a curved edge portion 420 of the conductive coating 406) modify the electric field in the vicinity of the groove 502 such that electric equipotential lines, relative to there being no groove 502 provided (i.e., relative to the particle beam apparatus 400), are spaced further apart, thereby indicating a reduction in electric field strength. These effects, relative to there being no groove 502 provided, may reduce electric field enhancement in the vicinity of the edge portion 420 of the conductive coating 406.

In some embodiments, the cross-section of the groove 502 may be rectangular. The rectangular cross-section of the groove 502 may have rounded edges. Advantageously, from a manufacturing perspective, a groove 502 that is rectangular may be relatively simple to form in the table body 404 (for example, by machining) In some embodiments, the cross-section of the groove 502 may be a shape that is neither circular nor rectangular. Rather, the cross-section of the groove 502 may be a different shape. Regardless of the shape of the groove 502, the edge portion 420 of the conductive coating 406 may be disposed within the groove 502. It will be appreciated that, in some embodiments of the present disclosure, the profile shape provided on the upper surface 416 of the table body 404 may be a profile shape that is not a groove 502. Rather, the profile shape may be any deviation from a generally flat upper surface 416 of the table body 404. The profile shape may be such that a surface of the profile shape is below the upper surface 416 of the table body 404. The profile shape may be such that a surface of the profile shape is above the upper surface 416 of the table body 404. A gap between the upper surface 416 of the table body 404 may be small. A profile shape having a surface below the upper surface 416 of the table body 404 may therefore be advantageous to maintain, in use, a small gap between the substrate 414 and the conductive object 402. The profile shape may comprise a curved surface or edge. In some embodiments, the edge portion 420 of the conductive coating 406 may be disposed on the profile shape.

In some embodiments, electric field enhancement may be reduced by providing the table body 404 with a feature proximate to an edge portion 420 of the conductive coating 406, wherein the feature comprises a groove on a surface of the table body 404, and wherein the edge portion 420 of the conductive coating 406 is disposed adjacent to said groove, and wherein a conductor is provided within the groove. An example of such an embodiment is shown in FIGS. 9 and 10.

A particle beam apparatus 900 according to a second embodiment of the present disclosure is now described with reference to FIGS. 9 and 10.

Figure 9:
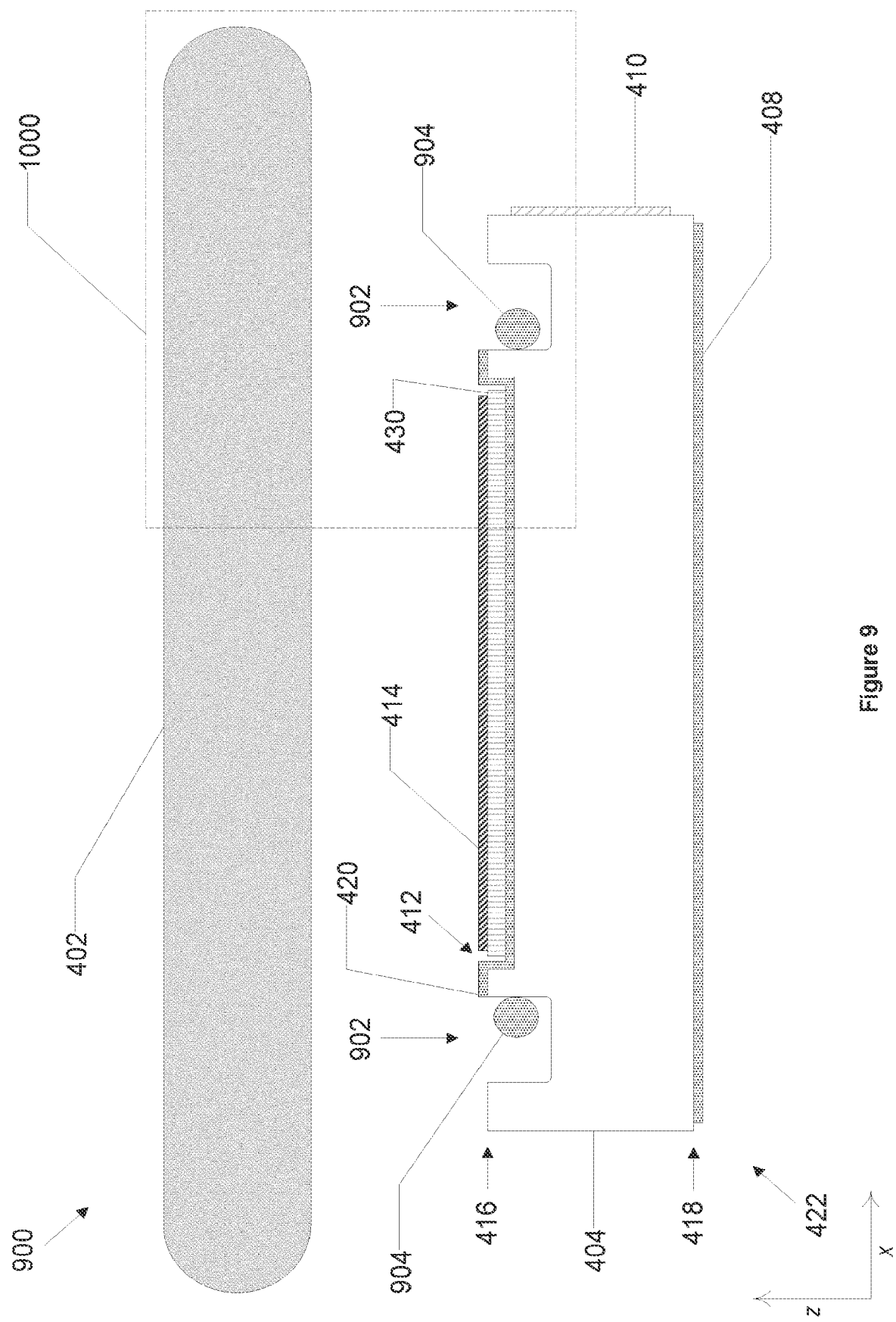
FIG. 9 schematically depicts an exemplary part of a particle beam apparatus and a substrate, according to some embodiments of the present disclosure.
Figure 10:
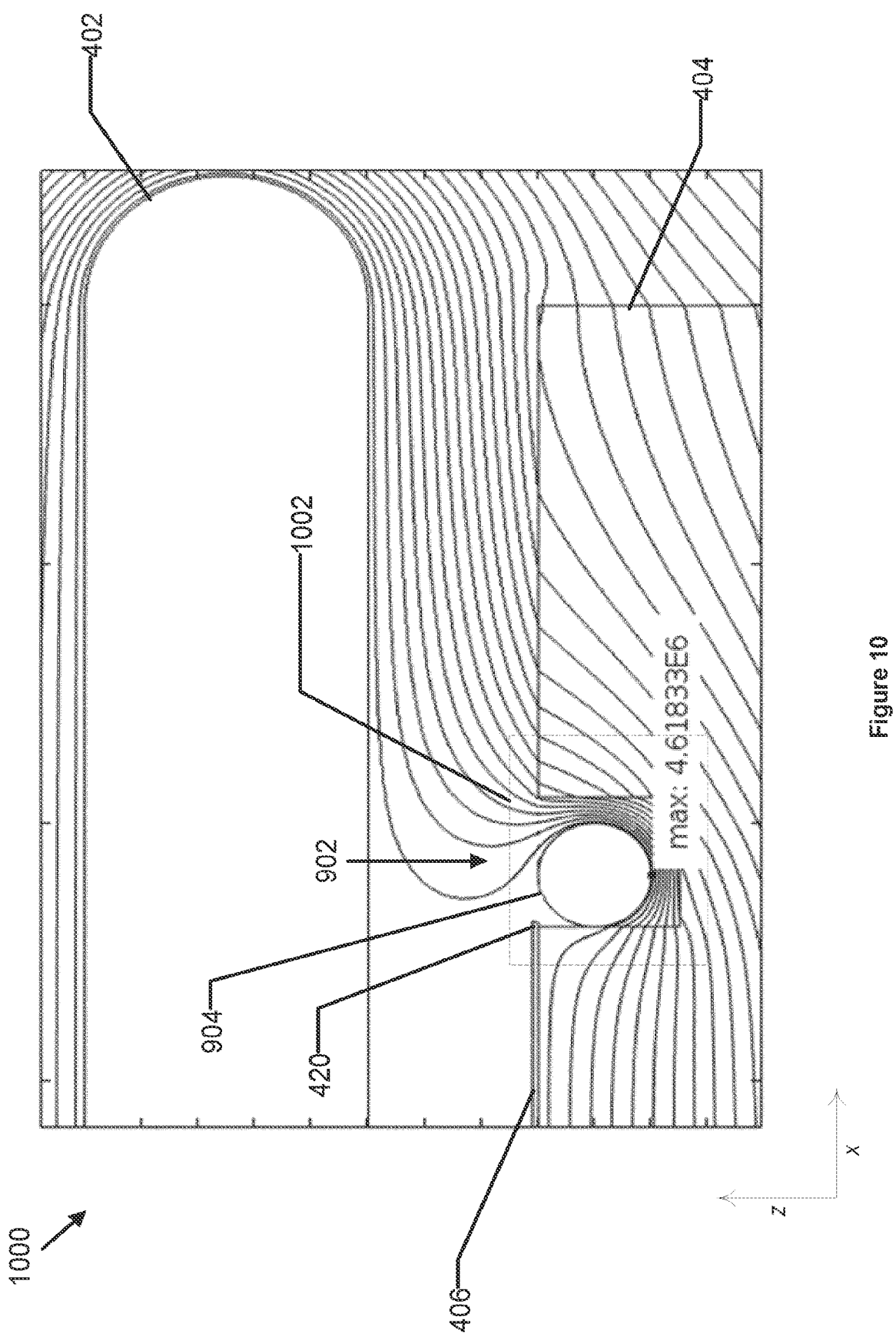
FIG. 10 illustrates a plot of electric equipotential lines corresponding to the part of the particle beam apparatus shown in FIG. 9, according to some embodiments of the present disclosure.

The particle beam apparatus 900 shown in FIG. 9 shares several features in common with the particle beam apparatus 400 shown in FIG. 4. Some differences between the particle beam apparatus 900 and the particle beam apparatus 400 are described. Any features of the particle beam apparatus 900 shown in FIG. 9 which generally correspond to, and may be generally the same as, features of the particle beam apparatus 400 shown in FIG. 4 (or features of any other figure) share common reference numerals therewith.

FIG. 9 shows a cross-section through part of a particle beam apparatus 900 according to some embodiments of the present disclosure. In addition to components of the particle beam apparatus 400 of FIG. 4, the particle beam apparatus 900 may comprise a groove 902 and a conductor 904.

In some embodiments, the groove 902 may be located on the upper surface 416 of the table body 404. The groove 902 may be described as a deviation from a flat upper surface 416 of the table body 404. The groove 902 is located between outer edges of the upper surface 416 of the table body 404 and the recess 412. The groove 902 may be rectangular in cross-section. The groove 902 may form a continuous channel that surrounds the conductive coating 406, in a similar arrangement to the groove 502 of particle beam apparatus 500 shown in FIG. 5. However, unlike the particle beam apparatus 500 shown in FIG. 5, the edge portion 420 of the conductive coating 406 is not contained within the groove 902. Rather, the edge portion 420 of the conductive coating 406 is disposed adjacent to the groove 902. In some embodiments, the conductive coating 406 may extend such that a portion of the conductive coating 406 is disposed within the groove 902. However, provision of the conductor 904, as described below, may have little effect on an electric field in a vicinity of the conductor 904 if the conductive coating 406 is provided within the groove 902.

In some embodiments, the cross-section of the groove 902 may have any different shape, for example, the cross-section of the groove 902 may be generally circular. Advantageously, from a manufacturing perspective, a groove 902 that is rectangular may be relatively simple to form in the table body 404 (for example, by machining) In some embodiments of the present disclosure, the cross-section of the groove 902 may be a shape that is neither circular nor rectangular.

In some embodiments, the conductor 904 may be an electrical conductor. The conductor 904 may comprise a cylindrical member. The radius of the cylindrical member which constitutes the conductor 904, and the overall proportions of the conductor 904, are such that the conductor 904 may fit entirely within the groove 902. The conductor 904 is disposed within the groove 902. The conductor 904 may provide a larger radius of curvature of conducting material at the edge portion 420 of the conductive coating 406.

In use, the conductor 904 may be held at an electrical potential that is substantially equal to the electrical potential at which the conductive coating 406 and the conductive object 402 are held.

As the conductive object 402, the conductive coating 406, and the conductor 904 are in close proximity to each other and are held at the same potential, electric equipotential lines may follow the general shape of the combined system defined by the conductive object 402, the conductive coating 406, and the conductor 904. In some embodiments, the conductive coating 406 may contact the conductor 904. Electric equipotential lines may be generally the same as when the conductive coating 406 does not contact the conductor 904.

FIG. 10 shows a plot of electric equipotential lines in a portion 1000 of the part of the particle beam apparatus 900 shown in FIG. 9, when the conductive object 402, the conductive coating 406, and the conductor 904 are held at a negative potential (such as −1 kV, −10 kV, or lower) and surrounding components, i.e., the conductive base 408 and the vacuum chamber (not shown), are held at a relatively positive potential (such as 0 V). In the vicinity 1002 of the edge portion 420 of the conductive coating 406, equipotential lines partially wrap around the conductor 904 and (at the current equipotential plotting resolution) are less concentrated at the edge portion 420 of the conductive coating 406 as compared, for example, with the arrangement shown in FIG. 8. Equipotential lines are spatially concentrated in this vicinity 1002. The highest electric field strength in the vicinity 1002 of the edge portion 420 of the conductive coating 406, using the particle beam apparatus 900, is $4.6 \times 10^6$ V m$^{-1}$.

Advantageously, as may be seen from FIGS. 8 and 10, by providing the conductor 904 within the groove 902, wherein the conductor 904 is held at the same electric potential as the conductive object 402 and the conductive coating 406, the electric field strength in the vicinity 1002 of the edge portion 420 of the conductive coating 406 may be reduced relative to an arrangement wherein there is no groove 902 or conductor 904 provided. Using the particle beam apparatus 900, curved edges of the conductor 904 may modify the electric field in the vicinity of the edge portion 420 of the conductive coating 406 such that electric equipotential lines, relative to there being no conductor 904 provided in a groove 902 (i.e., relative to the particle beam apparatus 400 shown in FIG. 4), are spaced further apart, thereby indicating a reduction electric field strength.

By providing a groove 902, a larger thickness of conductor 904 may be provided adjacent to the edge portion 420 of the conductive coating 406. A larger thickness of conductor 904 may have improved electric field strength reduction properties in the vicinity of the edge portion 420 of the conductive coating 406.

In some embodiments, the conductor 904 may comprise a wire. The wire may be shaped such that it may be described as a coiled wire. The wire may be wound around an axis which corresponds to a longitudinal axis of the above-described cylindrical member. Gaps between adjacent sections of the wire may be narrow. The general outer shape defined by the coiled wire may correspond to the cylindrical shape defined by the above-described cylindrical member. A conductor 904 formed from a coiled wire may have less mass and/or be more flexible than a conductor 904 (shown in FIG. 9) formed from a cylindrical member. Advantageously, this may allow for easier assembly of the conductor 904 and/or allow for a greater range of fitting tolerances. Forming the conductor 904 from a coiled wire may result in a reduction in electric field strength which is equivalent to the reduction in electric field strength achieved if the conductor 904 is formed from a cylindrical member (as shown in FIG. 9).

It will be appreciated that the conductor 904 may be formed from a single piece of conductive material or from multiple pieces of conductive material. Forming the conductor 904 from multiple pieces of conductive material may be simpler to manufacture. Individual pieces of conductive material from which a conductor is formed may comprise no sharp edges. In some embodiments, individual pieces of conductive material from which a conductor is formed may be disposed such that said individual pieces are located in close proximity to each other.

In some embodiments, electric field enhancement may be reduced by providing the table body 404 with a feature proximate to an edge portion 420 of the conductive coating 406, wherein the feature comprises an insulating material that covers an intersection between the table body 404 and an edge portion 420 of the conductive coating 406, and is in contact with said intersection. Examples of such embodiments are shown in FIGS. 11 to 14.

A particle beam apparatus 1100 according to some embodiments of the present disclosure is now described with reference to FIGS. 11 and 12.

Figure 11:
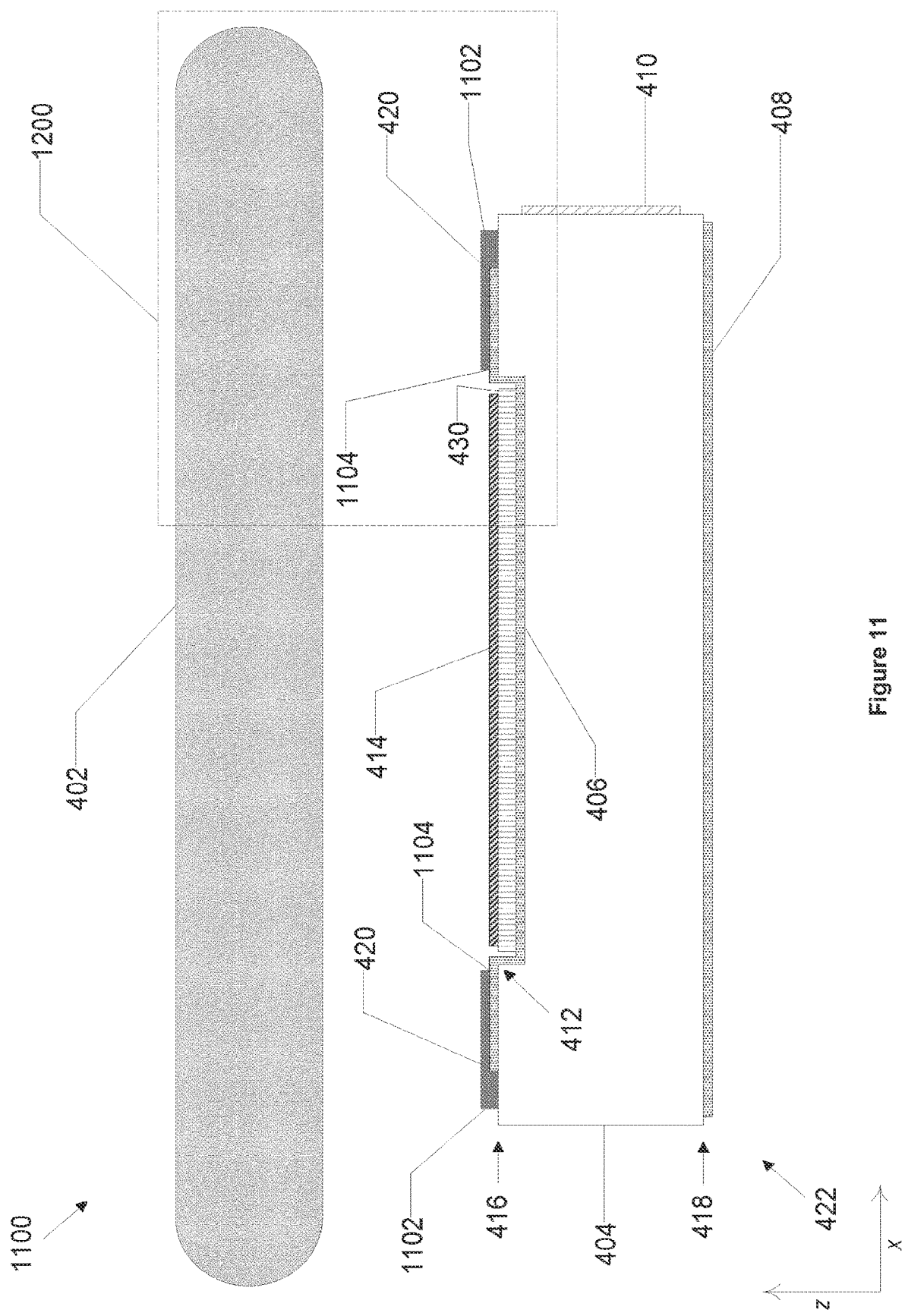
FIG. 11 schematically depicts an exemplary part of a particle beam apparatus and a substrate, according to some embodiments of the present disclosure.

The particle beam apparatus 1100 shown in FIG. 11 shares several features in common with the particle beam apparatus 400 shown in FIG. 4. Some differences between the particle beam apparatus 1100 and the particle beam apparatus 400 will be described. Any features of the particle beam apparatus 1100 shown in FIG. 11 which generally correspond to, and may be generally the same as, features of the particle beam apparatus 400 shown in FIG. 4 (or features of any other figure) share common reference numerals therewith.

FIG. 11 shows part of a cross-section through the particle beam apparatus 1100 according to some embodiments of the present disclosure. In addition to components of the particle beam apparatus 400 of FIG. 4, the particle beam apparatus 1100 may comprise an insulating material 1102. The insulating material 1102 may be an electrical insulator. The insulating material 1102 shown in FIG. 11 has a higher dielectric constant than that of the medium that is disposed between the conductive object 402 and the upper surface 416 of the table body 404. In some embodiments, the insulating material 1102 may not have a higher dielectric constant than that of the medium that is disposed between the conductive object 402 and the upper surface 416 of the table body 404. When the particle beam apparatus 1100 is used as part of a scanning electron microscope system for inspecting a substrate 414, the medium that is disposed between the conductive object 402 and the upper surface 416 of the table body 404 may be a vacuum or a low-pressure gas.

In some embodiments, the insulating material 1102 may be arranged such that it is in contact with the table body 404 and a portion of the conductive coating 406. The insulating material 1102 is in contact with the edge portion 420 of the conductive coating 406 such that the insulating material 1102 is in contact with an intersection between the table body 404 and the edge portion 420 of the conductive coating 406. In this embodiment, the insulating material 1102 may extend from a peripheral portion of the upper surface 416 of the table body 404, over the edge portion 420 of the conductive coating 406 towards a central portion of the upper surface 416 of the table body 404. The shape of the insulating material 1102 may therefore be described as a rectangular coating with a central, generally circular aperture. The insulating material 1102 substantially covers the edge portion 420 of the conductive coating 406. The edge portion 420 of the conductive coating 406 may be in contact with the table body 404 and the insulating material 1102.

An electric triple junction may be defined by the point where a conductor, an insulator, and a third medium meet. The third medium may be a vacuum, a low-pressure gas, or ambient air. Electric field enhancement is pronounced at an electric triple junction. The table body 404 is formed from an insulator and the conductive coating 406 is formed from a conductor. In the particle beam apparatus 400 shown in FIG. 4, an electric triple junction 426 is formed at the edge portion 420 of the conductive coating 406, where the conductive coating 406, the table body 404, and the vacuum or the low-pressure gas meet.

The insulating material 1102 may be described as encapsulating the electric triple junction 426. Advantageously, this may counteract cold field emission of electrons from the electric triple junction 426.

Figure 12:
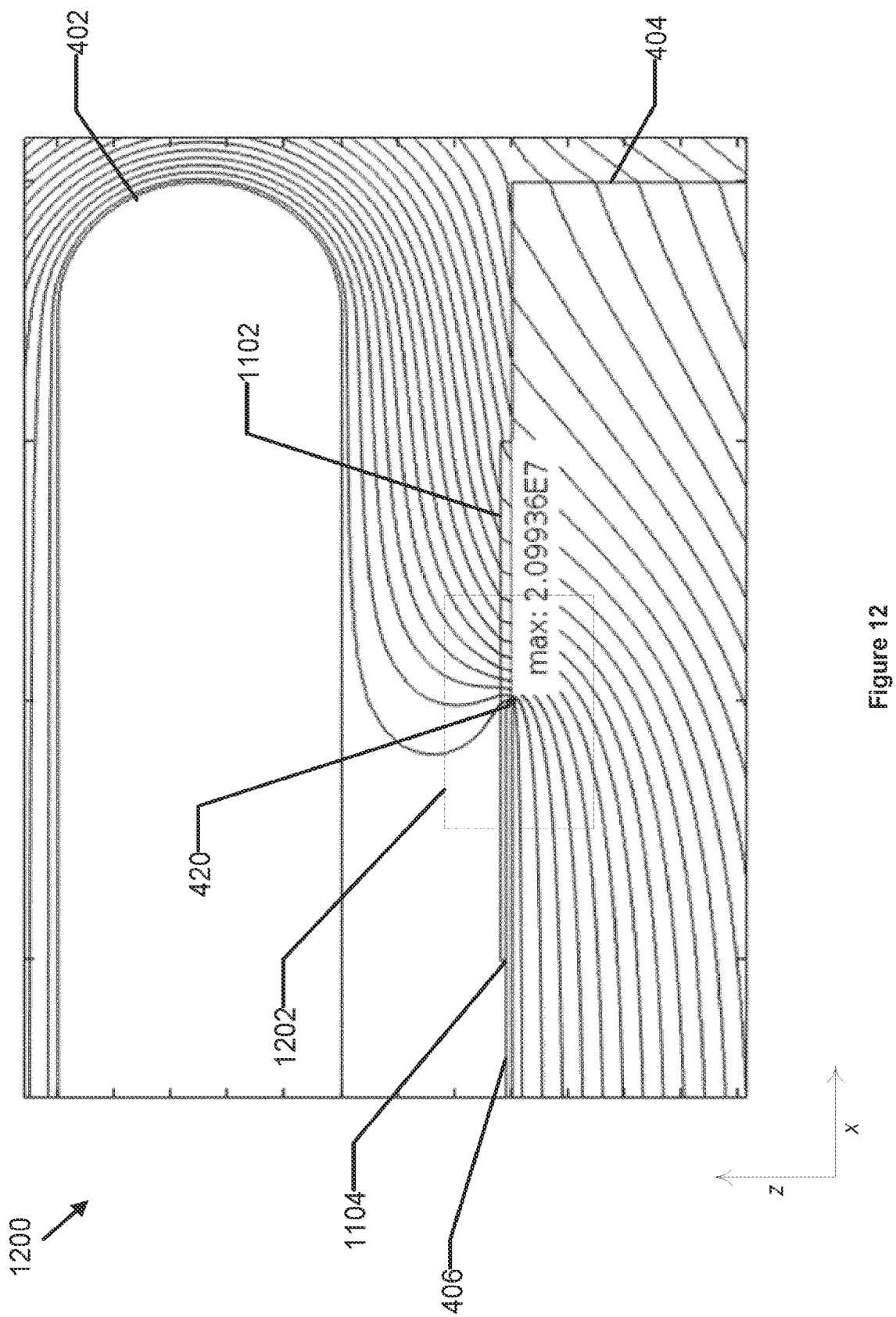
FIG. 12 illustrates a plot of electric equipotential lines corresponding to the part of the particle beam apparatus shown in FIG. 11, according to some embodiments of the present disclosure.

In some embodiments, dielectric properties of the insulating material 1102 may reduce the electric field strength in the vicinity of the edge portion 420 of the conductive coating 406 for the particle beam apparatus 1100 shown in FIGS. 11 and 12 (relative, for example, to the electric field strength at the electric triple junction 426 of the particle beam apparatus 400 shown in FIG. 4). By providing the insulating material 1102, an electric triple junction 426 formed in the particle beam apparatus 400 shown in FIG. 4, is displaced to form a displaced electric triple junction 1104. Both of these effects may reduce electric field enhancement at the edges of the conductive coating 406. These effects are described in detail further below.

In some embodiments, the insulating material 1102 as part of the particle beam apparatus 1100, may cover the electric triple junction 426 that would be formed at the edge portion 420 of the conductive coating 406 in the absence of such an insulating material 1102 (see FIG. 4), and forms the displaced electric triple junction 1104 in another location. The insulating material 1102 effectively displaces the electric triple junction 426 formed at the edge portion 420 of the conductive coating 406 to a location that is closer to a more preferred location. For example, this more preferred location may be where the electric field strength is weaker than at the electric triple junction 426. This more preferred location may be further towards a central portion (i.e., closer to the recess 412) of the conductive coating 406 than the electric triple junction 426, as shown in FIGS. 11 and 12.

FIG. 12 shows a plot of electric equipotential lines in a portion 1200 of the part of the particle beam apparatus 1100 shown in FIG. 11, when the conductive object 402 and the conductive coating 406 are held at a negative potential (such as −1 kV, −10 kV, or lower) and surrounding components, i.e., the conductive base 408 and the vacuum chamber (not shown), are held at a relatively positive potential (such as 0 V). In the vicinity 1202 of the edge portion 420 of the conductive coating 406, equipotential lines partially wrap around the edge portion 420 of the conductive coating 406. The highest electric field strength in the vicinity 1202 of the edge portion 420 of the conductive coating 406, using the particle beam apparatus 1100, is $2.1 \times 10^7$ V m$^{-1}$. However, this relatively high electric field strength does not promote cold field emission of electrons since the edge portion 420 of the conductive coating 406 is encapsulated by the insulating material 1102.

In some embodiments, proximate to the displaced electric triple junction 1104, equipotential lines are absent (at the current equipotential plotting resolution). The location of the displaced electric triple junction 1104 thus corresponds to a region where the electric field strength is weaker than the electric field strength at the electric triple junction 426 (shown in FIG. 4). The location of the displaced electric triple junction 1104 may correspond to a region where there is low or zero electric field. There may be low or zero electric field in this region due to the conductive coating 406 and the conductive object 402 being held at the same electric potential. Displacing electric triple junctions to said regions is therefore advantageous as low or zero electric field enhancement may occur at these locations.

In some embodiments, dielectric properties of the insulating material 1102 may result in a reduced electric field strength relative to the insulating material 1102 not being provided (i.e., relative to the particle beam apparatus 400 shown in FIG. 4) in the vicinity 1202 of the edge portion 420 of the conductive coating 406. Electric triple junctions still exist (i.e., conductive coating 406, table body 404, insulating material 1102 junctions), but the material from which the insulating material 1102 is formed may be selected to have similar or greater electrical permittivity to the table body 404. This may reduce electric field enhancement at the edge portion 420 of the conductive coating 406. Including the insulating material 1102 is therefore advantageous as electric field strength is reduced, leading to lower likelihood of cold field emission of electrons and therefore a lower likelihood of arcing.

Alternatively, existing methods of dealing with electric triple junctions formed in high voltage apparatus exploit the cold field emission of electrons that is pronounced at an electric triple junction. Such methods may effectively provide a formation from insulating material that surrounds, but is spaced apart from, the electric triple junction. This formation acts as an electron catch surrounding the electric triple junction (typically formed as an extension of and/or addition to the table body 404). The electron catch is arranged proximate to and spaced apart from the electric triple junction, creating a hidden electric triple junction. Electrons emitted from the hidden electric triple junction collect on the (insulating) electron catch. Electrons collected on the electron catch alter the electric field in the vicinity of the electric triple junction. These electric field alterations reduce the likelihood of further cold field emission of electrons. However, the existing methods of dealing with electric triple junctions formed in high voltage apparatus are difficult to manufacture.

The inventors have recognized that, in the setup of the particle beam apparatus 400 shown in FIG. 4, a solution to the problem of dealing with electric triple junctions may be implemented. The particle beam apparatus 1100 does not remove the electric triple junction; rather, the electric triple junction is displaced to a location in which there is low or zero electric field. As such, electric field strength amplification, does not pose a problem when using the particle beam apparatus 1100.

A particle beam apparatus 1300 according to some embodiments of the present disclosure is now described with reference to FIG. 13.

Figure 13:
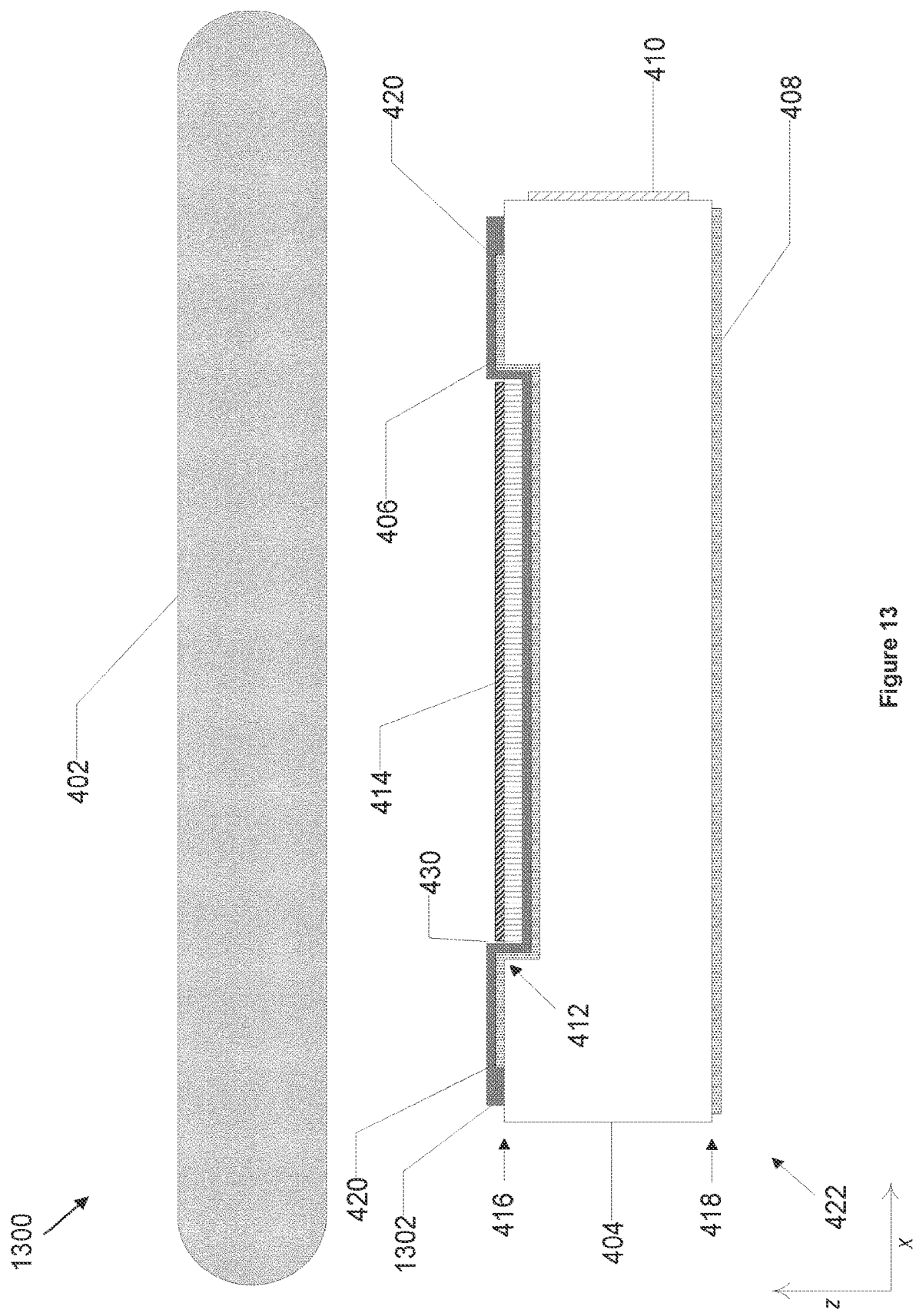
FIG. 13 schematically depicts an exemplary part of a particle beam apparatus and a substrate, according to some embodiments of the present disclosure.

The particle beam apparatus 1300 shown in FIG. 13 shares several features in common with the particle beam apparatus 1100 shown in FIG. 11. Some differences between the particle beam apparatus 1300 and the particle beam apparatus 1100 are described. Any features of the particle beam apparatus 1300 shown in FIG. 13 which generally correspond to, and may be generally the same as, features of the particle beam apparatus 1100 shown in FIG. 11 (or features of any other figure) share common reference numerals therewith.

FIG. 13 shows a cross-section through part of the particle beam apparatus 1300 according to an embodiment of the present disclosure. The particle beam apparatus 1300 comprises an insulating material 1302. The material from which the insulating material 1302 (of particle beam apparatus 1300) is formed has identical electrical properties to the material from which the insulating material 1102 (of particle beam apparatus 1100) is formed.

In some embodiments, the insulating material 1302 may be arranged such that it is in contact with the table body 404 and the conductive coating 406. The insulating material 1302 is in contact with the edge portion 420 of the conductive coating 406. The insulating material 1302 is provided on the upper surface 416 of the table body 404. The insulating material 1302 follows the contours of the conductive coating 406 into the recess 412. The shape of the insulating material 1302 may therefore be described as a rectangular coating. The insulating material 1302 may completely cover the conductive coating 406, including the edge portion 420. The conductive coating 406 is hence only in contact with the table body 404 and the insulating material 1302.

In use, a substrate 414 is disposed on the insulating material 1302 within the recess 412.

Electric field enhancement is pronounced at an electric triple junction. In the particle beam apparatus 400 shown in FIG. 4, the electric triple junction 426 is formed at the edge portion 420 of the conductive coating 406, where the conductive coating 406, the table body 404, and the vacuum or the low-pressure gas (disposed between the upper surface 416 of the table body 404 and the conductive object 402) meet. The arrangement of the insulating material 1302 according to the particle beam apparatus 1300 shown in FIG. 13 removes all such electric triple junctions (e.g., conductive coating 406, table body 404, vacuum junctions) from the system. Electric triple junctions may still exist (i.e., conductive coating 406, table body 404, insulating material 1302 junctions), but the material from which the insulating material 1302 is formed may be selected to have similar or greater electrical permittivity to the table body 404. This may reduce electric field enhancement at the edge portion 420 of the conductive coating 406, leading to lower likelihood of cold field emission of electrons and therefore less arcing.

Advantageously, the insulating material 1302 may serve to protect the conductive coating 406 from damage during handling and cleaning of the particle beam apparatus 1300. Further, this protection of the conductive coating 406 may prevent formation of sharp features (e.g., from scratches) on the conductive coating 406, which could form a further source for electric field amplification.

The insulating materials 1102, 1302 of the particle beam apparatus 1100, 1300 may have non-zero electrical conductivity. Charge may build up on the insulating materials 1102, 1302. This charge build-up may occur during use of the particle beam apparatus 1100, 1300, wherein the conductive coating 406 is held at a non-zero electric potential. By forming the insulating materials 1102, 1302 from a substance that has a non-zero (but relatively small) electrical conductivity, charge build-up may be gradually removed without causing significant electric field enhancement at an electric triple junction. The insulating materials 1102, 1302 may have a suitable surface resistance to allow charge build-up may be gradually removed whilst limiting power dissipation in the insulating materials 1102, 1302 to an acceptable level. For example, the insulating materials 1102, 1302 may have surface resistance of the order of $-10^{13}$ m$^{-2}$. Such a surface resistance, for a conductive coating 406 held at an electric potential of the order of 10 kV on a table body 404 which is 0.1 m in depth and which has a perimeter of 1 m, may limit power dissipation to below approximately 1 mW.

It will be appreciated that in order to prevent, or at least reduce, significant electric field enhancement at an electric triple junction, the insulating materials 1102, 1302 of the particle beam apparatus 1100, 1300 may be formed from a material that has similar or greater electrical properties to those of the material from which the table body 404 is formed.

It will be further appreciated that features from the embodiments of the present disclosure hitherto described may be used in combination with each other. For example, features of the particle beam apparatus 500 according to the first embodiment of the present disclosure shown in FIG. 5 may be combined with features of the particle beam apparatus 1100 according to some embodiments of the present disclosure shown in FIG. 11, thereby forming a particle beam apparatus 1400 shown in FIG. 14.

Figure 14:
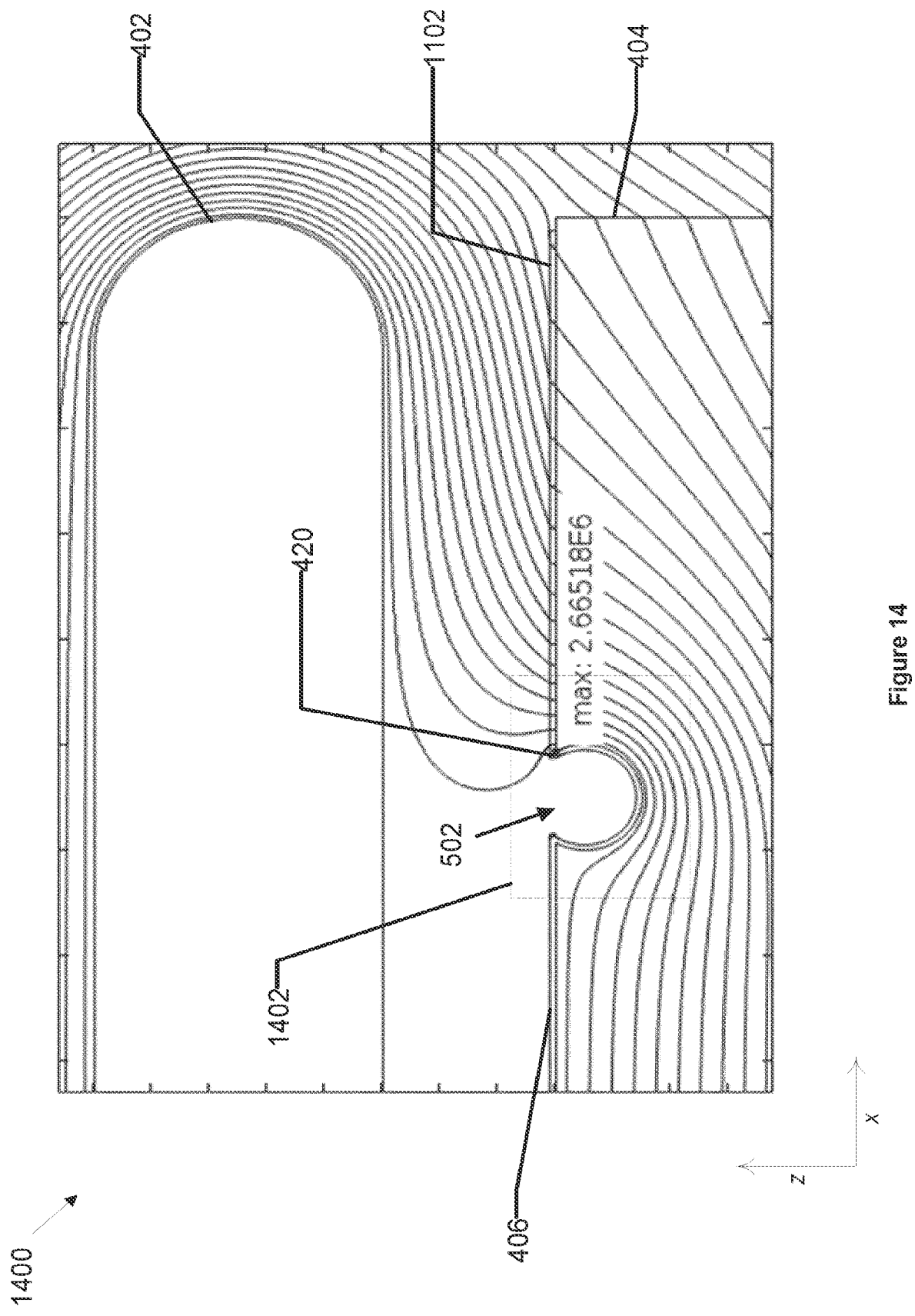
FIG. 14 illustrates a plot of electric equipotential lines corresponding to an exemplary particle beam apparatus, incorporating features of the particle beam apparatus shown in FIG. 5 and FIG. 11, according to some embodiments of the present disclosure.

FIG. 14 shows a plot of electric equipotential lines in a portion of particle beam apparatus 1400, when the conductive object 402 and the conductive coating 406 are held at a negative potential (such as −1 kV, −10 kV, or lower) and surrounding components, i.e., the conductive base 408 and the vacuum chamber (not shown), are held at a relatively positive potential (such as 0 V). In said fifth embodiment, the edge portion 420 of the conductive coating 406 is provided within the groove 502 on the upper surface 416 of the table body 404 (as first introduced in the particle beam apparatus 500 shown in FIG. 5). Further, the insulating material 1102 is provided adjacent to the edge portion 420 of the conductive coating 406 (as first introduced in in the particle beam apparatus 1100 shown in FIG. 11). An edge of the insulating material 1102 is in contact with the edge portion 420 of the conductive coating 406.

In some embodiments, edge portion 420 of the conductive coating 406 within the groove 502 may reduce electric field enhancement, relative to this feature not being provided, via the mechanisms previously described with reference to FIGS. 7 and 8. Effectively, since the conductive coating 406 extends into the groove 502 (and follows the contours of the groove 502) the end portion 420 of the conductive coating 406 provides a larger radius of curvature for electric equipotential lines to follow. Provision of the insulating material 1102 adjacent to the edge portion 420 of the conductive coating 406 reduces electric field enhancement, relative to this feature not being provided, via the mechanisms previously described with reference to FIG. 12. The highest electric field strength in the vicinity 1402 of the edge portion 420 of the conductive coating 406, using the particle beam apparatus 1400 according to the fifth embodiment of the present disclosure shown in FIG. 14, is $2.7 \times 10^6$ V m$^{-1}$. Combining features that separately reduce electric field strength proximate to an edge portion 420 of the conductive coating 406, as shown in the particle beam apparatus 1400, results in a greater reduction of electric field strength than the reduction in electric field strength achieved by using said features in isolation.

Embodiments of the present disclosure may comprise a groove 502 in which the end portion 420 of the conductive coating 406 is disposed (such as the particle beam apparatus 500, 1400 shown in FIGS. 5 and 14, respectively). As described above, the cross-section of the groove 502 may be circular, rectangular, or a shape that is neither circular nor rectangular. It may be advantageous for the shape of the cross-section of the groove 502 to comprise curves. It may be advantageous for the shape of the cross-section of the groove 502 to contain no sharp edges. For a groove 502 with a circular cross-section, such a cross-section may be characterised by a segment of a circle. A groove 502 may have a cross-section which is characterised by different segments of a circle in different embodiments of the present disclosure. For example, the particle beam apparatus 500 shown in FIG. 5 may comprise a groove 502, the cross-section of which is characterised by a circular segment that corresponds to less than half a circle. The particle beam apparatus 1400 shown in FIG. 14 may comprise a groove 502, the cross-section of which is characterised by a circular segment that corresponds to more than half a circle.

It will be appreciated that it is possible to provide or to not provide an insulating material 1102 regardless of the cross-section of the groove 502. For example, an embodiment of a particle beam apparatus may comprise the groove 502 and conductive coating 406 shown in FIG. 14, but without the insulating material shown in FIG. 14. Likewise, an embodiment of a particle beam apparatus may comprise the groove 502 and conductive coating 406 shown in FIG. 5, and may also comprise an insulating material 1102.

It will be further appreciated that more than one groove may be provided. For example, an embodiment of a particle beam apparatus according to the present disclosure may comprise the groove 502 on which the conductive coating 406 is provided (see FIGS. 5 to 7) and may also comprise a secondary groove. The secondary groove may be located on the upper surface 416 of the table body 404. The secondary groove may be described as a deviation from a generally flat upper surface 416 of the table body 404. The secondary groove may be described as a profile shape. The secondary groove may be located between outer edges of the upper surface 416 of the table body 404 and the groove 502. The secondary groove may be described as surrounding the groove 502. The groove 502 and the conductive coating 406 may be shaped and disposed in substantially the same manner as is shown in FIGS. 5 to 7. The conductive coating 406 may not enter the secondary groove. The secondary groove may be empty. The cross-section of the secondary groove may be similar to the cross-section of the groove 502 or may be different to the cross-section of the groove 502. There may be a difference in electric permittivity between a vacuum or low-pressure gas surrounding the table body 404 and a material from which the table body 404 is formed. Provision of the secondary groove may therefore shape a portion of the electric field between the conductive coating 406 and the conductive object 402. This may reduce the spatial concentration of electric equipotential lines in the vicinity of an edge portion 420 of the conductive coating 406. This may reduce electric field enhancement. Simulations (e.g., computer simulations) may be used to optimise the shape, size, and/or position of the secondary groove.

In some embodiments, electric field enhancement may be reduced in the vicinity of one or more sections of the table body 404 by forming an electrical connection between components provided on the table body 404. Specifically, some embodiments of the present disclosure reduce said electric field enhancement by forming electrical connections between the conductive coating 406 and the supplementary member 410; and between the supplementary member 410 and the conductive base 408. These electrical connections reduce electric field strength in the vicinity of the table body 404 when a voltage is applied across the conductive coating 406 and the conductive base 408. In some embodiments, the electric field in the vicinity of the table body 404 may be reduced relative to the electric field that would result if said electrical connection was not present. Examples of such embodiments are shown in FIGS. 15A, 15B, and 15C.

Object tables according to a sixth, seventh, and eighth embodiment of the disclosure are described with reference to FIGS. 15A, 15B, and 15C, respectively.

The object tables 1500A, 1500B, 1500C shown in FIG. 15 share several features in common with the object table 422 shown in other figures. The object tables 1500A, 1500B, 1500C may form part of a particle beam apparatus. The object tables 1500A, 1500B, 1500C may correspond to the object table that forms part of the positioning device 180 shown in FIG. 1. The object tables 1500A, 1500B, 1500C may be disposed proximate to a conductive object, in a similar arrangement to the object table 422 and the conductive object 402 of particle beam apparatus 400, 500, 900, 1100, 1300, 1400. Some differences between the object tables 1500A, 1500B, 1500C and the object table 422 of previous FIGS. are described below. Any features of the object tables 1500A, 1500B, 1500C shown in FIG. 15 which generally correspond to, and may be generally the same as, features of the object table 422 shown in any other figure share common reference numerals therewith.

Figure 15A:
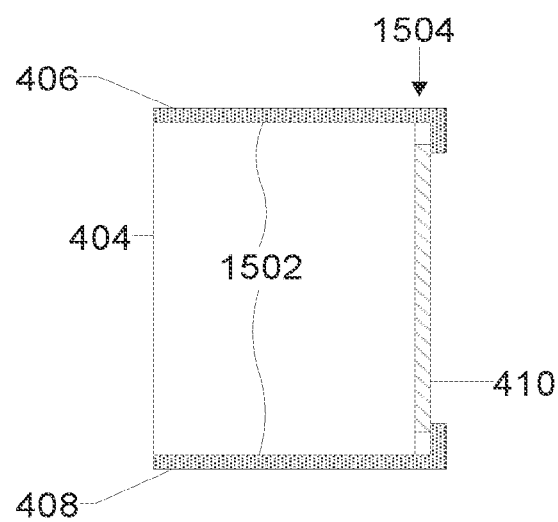
FIGS. 15A, 15B, and 15C schematically depict exemplary object tables, according to some embodiments of the present disclosure.
Figure 15B:
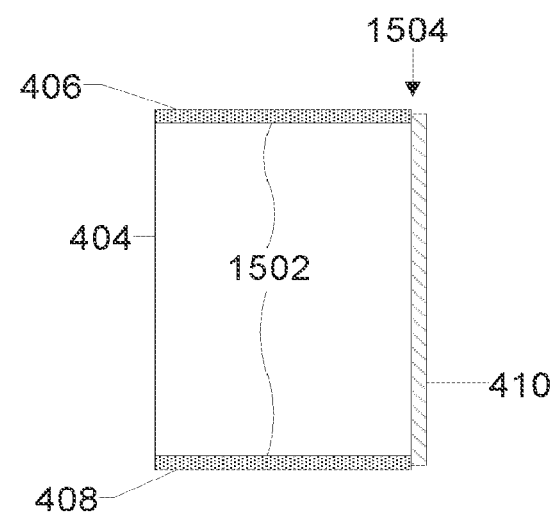
Figure 15C:
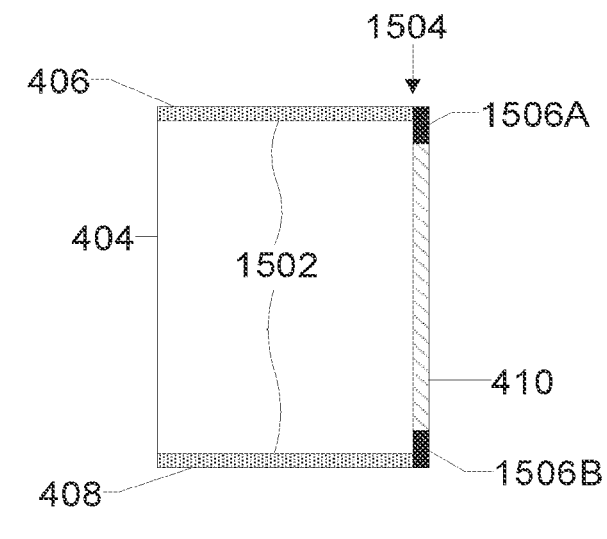

FIG. 15A shows a cross-section of a portion 424 (see FIG. 4) of an object table 1500A. The conductive coating 406 and the conductive base 408 may be described as conductive members 1502.

The supplementary member 410 is provided on a surface of the table body 404 between the upper surface 416 of the table body 404 and the lower surface 418 of the table body 404. The supplementary member 410 may therefore be described as being provided on a surface of the table body 404 between the conductive members 1502. This surface of the table body 404 between the conductive members 1502 may be described as a side surface 1504. The supplementary member 410 extends to cover most of the side surface 1504 of the table body 404.

In the object table 1500A shown in FIG. 15A, the conductive coating 406 extends beyond an edge of the upper surface 416 of the table body 404. An edge of the conductive coating 406 is shaped so that said edge of the conductive coating 406 is in contact with the supplementary member 410. Similarly, the conductive base 408 extends beyond an edge of the lower surface 418 of the table body 404. An edge of the conductive base 408 is shaped so that said edge of the conductive base 408 is in contact with the supplementary member 410.

The side surface 1504 of the table body 404 may be described as being covered by a combination of the conductive coating 406, the conductive base 408, and the supplementary member 410. The edge of the conductive coating 406 that makes contact with the supplementary member 410 overlaps partially with the supplementary member 410. The edge of the conductive base 408 that makes contact with the supplementary member 410 overlaps partially with the supplementary member 410. These overlaps may create good electrical contact between the conductive coating 406, the supplementary member 410, and the conductive base 408.

As described above, in use, the conductive coating 406 is generally held at a large negative electrical potential (such as −10 kV) and the conductive base 408 is generally held at a ground or neutral electric potential (such as 0 V). A potential difference therefore exists between the conductive members 1502 in use. By forming an electrical connection between the supplementary member 410 and each of the two conductive members 1502, the entire potential difference between the two conductive members 1502 is applied across the supplementary member 410. As a result, a gradient of electrical potential is provided across the side surface 1504 of the table body 404.

The inventors have realised that, in the absence of an electrical connection formed between the supplementary member 410 and each of the two conductive members 1502 (such as in the particle beam apparatus 400 shown in FIG. 4), the lower resistance of the supplementary member 410 relative to the table body 404 leads to a spatially concentrated drop in electric potential between the two conductive members 1502. This spatially concentrated drop of electric potential results in electric field enhancement in the vicinity of the table body 404, particularly in regions 428 (see FIG. 4). In particular, in the particle beam apparatus 400 shown in FIG. 4, the spatially concentrated drop of electric potential results in electric field enhancement proximate to portions 428 of the side surface 1504 of the table body 404 which are not covered by the supplementary member 410.

Advantageously, the object table 1500A according to the sixth embodiment of the present disclosure shown in FIG. 15A provides an electrical connection between the conductive coating 406 and the supplementary member 410, and also between the supplementary member 410 and the conductive base 408. Therefore, the drop in electrical potential along the side surface 1504 of the table body 404 is not concentrated in a spatially limited region. Electric field enhancement at the side surface 1504 of the table body 404, which would be present in, for example, the particle beam apparatus 400 shown in FIG. 4, is thus prevented. In use, a small but non-zero current may flow between the conductive coating 406 and the conductive base 408. Said current may depend on a voltage difference between the conductive coating 406 and the conductive base 408, and on the electric resistivity of the supplementary member 410.

FIGS. 15B and 15C show variants of the object table 1500A a shown in FIG. 15A, defining seventh and eighth embodiments of the present disclosure. The object tables 1500B, 1500C shown in FIGS. 15B and 15C form an electrical connection between the conductive coating 406 and the supplementary member 410; and between the supplementary member 410 and the conductive base 408, in a similar arrangement to the object table 1500A shown in FIG. 15A. FIGS. 15B and 15C illustrate variants in how the formation of said electrical connection is achieved. Electric field enhancement proximate to the table body 404 is prevented via the same mechanisms as those described above with reference to the object table 1500A of FIG. 15A.

The object table 1500B according to a seventh embodiment of the present disclosure is now described with reference to FIG. 15B. An electrical connection exists between the conductive coating 406 and the supplementary member 410. An electrical connection exists between the supplementary member 410 and the conductive base 408. These electrical connections are formed by, relative to the object table 422 of the particle beam apparatus 400 shown in FIG. 4, extending one or more dimensions of the conductive coating 406, the conductive base 408, and the supplementary member 410.

In the object table 1500B shown in FIG. 15B, the conductive coating 406 extends so that it is adjacent to the side surface 1504 of the table body 404. The conductive base 408 extends so that it is adjacent to the side surface 1504 of the table body 404. The supplementary member 410 extends to make contact with the conductive coating 406 and with the conductive base 408.

There is overlap of the supplementary member 410 with the edge of the conductive coating 406 with which the supplementary member 410 makes contact. There is overlap of the supplementary member 410 with the edge of the conductive base 408 with which the supplementary member 410 makes contact. These overlaps may create good electrical contact between the conductive coating 406, the supplementary member 410, and the conductive base 408.

The object tables 1500A, 1500B may be described as embodiments according to the present disclosure wherein the electrical connection between the supplementary member 410 and each of the two conductive members 1502 is formed by direct contact between the conductive members 1502 and the supplementary member 410. Alternatively, in other embodiments of the present disclosure, the electrical connection between the supplementary member 410 and each of the two conductive members 1502 is formed via the provision of separate conducting members 1506A, 1506B.

An object table 1500C according to an eighth embodiment of the present disclosure is now described with reference to FIG. 15C. An electrical connection exists between the conductive coating 406 and the supplementary member 410. An electrical connection exists between the supplementary member 410 and the conductive base 408. These electrical connections are formed by, relative to the particle beam apparatus 400 shown in FIG. 4, providing conducting members 1506A, 1506B between the supplementary member 410 and each of the conducting members 1502.

A conducting member 1506A is provided between the conductive coating 406 and the supplementary member 410 such that the conducting member 1506A makes contact with the conductive coating 406 and with the supplementary member 410. A conducting member 1506B is provided between the conductive base 408 and the supplementary member 410 such that the conducting member 1506B makes contact with the conductive base 408 and with the supplementary member 410. The conducting members 1506A, 1506B are formed from a material that is an electrical conductor. The conducting members 1506A, 1506B may be shaped such that they do not increase the overall size of the object table 1500C.

In any of the object tables 1500A, 1500B, 1500C, it may be desirable to extend the supplementary member 410 to cover as much of the side surface 1504 of the table body 404 as possible. This provides a greater physical distance over which the electric potential may drop between the conductive members 1502. Advantageously, this may create a lower electric field strength in the vicinity of the side surface 1504 of the table body 404.

In any of the object tables 1500A, 1500B, 1500C, electrical contact between the conductive coating 406 and the supplementary member 410; and between the supplementary member 410 and the conductive base 408, may be made generally across the whole of each edge of the conductive coating 406 and the supplementary member 410 and/or across the whole of each edge of the supplementary member 410 and the conductive base 408. Alternatively, electrical contact between the conductive coating 406 and the supplementary member 410; and between the supplementary member 410 and the conductive base 208, may be made at one or more portions of corresponding edges.

The resistance of the supplementary member 410 may have a lower limit. This may limit the flow of current in through the supplementary member 410. This may be useful to prevent heating of the supplementary member 410 and/or the table body 404.

In any of the object tables 1500A, 1500B, 1500C, electrical contact between the supplementary member 410 and a conductive member 1502 may be made generally across a whole edge of the conductive member 1502 and/or the supplementary member 410. Alternatively, electrical contact between the supplementary member 410 and a conductive member 1502 may be made only at one or more portions of an edge of the conductive member 1502 and/or the supplementary member 410.

Advantageously, forming an electrical connection between the supplementary member 410 and a conductive member 1502 across a whole edge of the conductive member 1502 and/or the supplementary member 410 may result in good electrical connection between the conductive member 1502 and the supplementary member 410. Further, such an arrangement may lead to a drop in electric potential across the surface of the table body 404 on which the supplementary member 410 is disposed which is not concentrated in a spatially limited region. This may lead to reduced electric field enhancement.

Further embodiments may be described in the following clauses:

1. A particle beam apparatus, comprising:
   a conductive object; and
   an object table configured to support an object, the object table comprising:
   a table body; and
   a conductive coating provided on at least a portion of a surface of the table body;
   wherein the conductive object is disposed such that at least part of the conductive object faces the conductive coating, and wherein the table body is provided with a feature at or near an edge portion of the conductive coating, said feature being arranged so as to reduce an electric field strength in the vicinity of the edge portion when a voltage is applied to both the conductive object and the conductive coating.

2. The particle beam apparatus according to clause 1, wherein the feature comprises a profile shape on a surface of the table body, wherein said profile shape has a component that lies out of a main plane of the conductive coating, and wherein the edge portion of the conductive coating is disposed on said profile shape.

3. The particle beam apparatus according to clause 2, wherein there is a greater distance between the conductive object and the component of the profile shape that lies out of the main plane of the conductive coating than a distance between the conductive object and the main plane of the conductive coating.

4. The particle beam apparatus according to clause 3, wherein the profile shape comprises a groove.

5. The particle beam apparatus according to clause 4, wherein the groove comprises a cross-section which is a segment of a circle.

6. The particle beam apparatus according to clause 4, wherein the groove comprises a cross-section which is generally rectangular with rounded edges.

7. The particle beam apparatus according to any of clauses 2 to 6, wherein the profile shape comprises a curved surface or edge.

8. The particle beam apparatus according to clause 1, wherein the feature comprises a groove on a surface of the table body, and wherein the edge portion of the conductive coating is disposed at or near said groove and wherein a conductor is provided within the groove.

9. The particle beam apparatus according to any of clause 4 to clause 8, wherein the feature comprises a secondary groove which is provided on a surface of the table body.

10. The particle beam apparatus according to any preceding clause, wherein the feature comprises an insulating material that covers an intersection between the table body and an edge portion of the conductive coating.

11. The particle beam apparatus according to clause 10, wherein the insulating material substantially covers the entirety of the conductive coating.

12. The particle beam apparatus according to clause 10, wherein the insulating material covers only a portion of the conductive coating.

13. The particle beam apparatus according to any of clause 10 to clause 12, wherein the insulating material is in contact with one or more intersections between the table body and an edge portion of the conductive coating.

14. The particle beam apparatus according to clause 13 when dependent on clause 12, wherein an electric triple junction at an intersection between the table body and an edge portion of the conductive coating and an environment is displaced by the insulating material to a region where an electric field strength is lower than an electric field strength in a region of the edge portion of the electric triple junction prior to being displaced.

15. The particle beam apparatus according to any of clauses 10 to 14, wherein all intersections between the table body and edge portions of the conductive coating are covered by the insulating material.

16. The particle beam apparatus of any of clauses 10 to 15, wherein the insulating material has an electrical conductivity such that, in use, a finite current may flow through the insulating material.

17. The particle beam apparatus of any of clauses 10 to 16, wherein the insulating material has a dielectric constant which is greater than a dielectric constant of the table body.

18. The particle beam apparatus according to any preceding clause, wherein the particle beam apparatus is an electron beam apparatus, a scanning electron microscope, an electron beam direct writer, an electron beam projection lithography apparatus, an electron beam inspection apparatus, an electron beam defect verification apparatus, or an electron beam metrology apparatus.

19. The object table for use in the particle beam apparatus according to any preceding clause.

20. An object table configured to support an object, comprising:
a table body;
a first conductive member provided on a surface of the table body;
a second conductive member provided on a surface of or within the table body; and a supplementary member having an electrical resistance lower than an electrical resistance of the table body;
wherein the supplementary member is disposed on a surface of the table body such that the supplementary member extends between the first conductive member and the second conductive member, and wherein an electrical connection is formed between the supplementary member and each of the first conductive member and the second conductive member.

21. The object table of clause 20, wherein the electrical connection between the supplementary member and each of the two conductive members is formed by direct contact between one or more of the conductive members and the supplementary member.

22. The object table of clause 20, wherein the electrical connection between the supplementary member and each of the two conductive members is formed via the provision of a separate conducting portion.

23. The object table according to any of clauses 20 to clause 22, wherein the object table is suitable for use in an electron beam apparatus, a scanning electron microscope, an electron beam direct writer, an electron beam projection lithography apparatus, an electron beam inspection apparatus, an electron beam defect verification apparatus, or an electron beam metrology apparatus.

24. The object table according to any of clauses 20 to clause 23, wherein the first conductive member is provided as a coating on the table body.

25. The object table according to any of clauses 20 to clause 24, wherein the second conductive member is provided as a coating on the table body.

26. The object table according to any of clauses 20 to clause 25, wherein the supplementary member is a mirror provided on a surface of the table body.

27. The object table according to any of clauses 20 to clause 25, wherein the supplementary member is provided as a mirror coating on the table body.

28. The particle beam apparatus according to clause 10, wherein an intersection between the table body and an edge portion of the insulating material is arranged in a region where an electric field strength is lower than an electric field strength in a region of intersection between the table body and the edge portion of the conductive coating.

Specific voltages have been given when describing the functional behaviour of particle beam apparatus and object tables described in the present disclosure. It will be appreciated that these voltages are given purely as examples and are not intended to be limiting. For example, the conductive object 402 and the conductive coating 406 have been described as being held at an electrical potential of −1 kV, −10 kV, or lower, and the conductive base 408 and the vacuum chamber have been described as being held at 0 V.

The conductive object 402 and the conductive coating 406 may be held at any large negative electrical potential, such as −80 kV. The conductive base 408 and the vacuum chamber may alternatively be held at a voltage which is positive with respect to the voltage at which the conductive object 402 and the conductive coating 406 are held, such as −40 kV.

Specific shapes have been given when describing the arrangement of particle beam apparatus and object tables described in the present disclosure. It will be appreciated that these shapes are given purely as examples and are not intended to be limiting. For example, the table body 404 and the conductive object 402 have been described as generally cuboidal. The table body 404 may alternatively be generally trapezoidal, may comprise one or more hollow sections, and/or may comprise curved edges. In practice, the top surface 416 of the table body 404 would generally be chosen to be flat. The conductive object 402 may alternatively comprise multiple members which together constitute the conductive object 402. Said multiple members may have non-trivial shapes. Said multiple members may either overlap or may be placed to have a generally small gap between them. Said multiple members may be at different heights (above the substrate 414).

Specific orientations have been given when describing the relative arrangement of components. It will be appreciated that these orientations are given purely as examples and are not intended to be limiting. For example, the xy-stage of the positioning device 180 has been described as being operable to position an object in a substantially horizontal plane. The xy-stage of the positioning device 180 may alternatively be operable to position an object in a vertical plane or in an oblique plane. Orientations of components may vary from the orientations described herein whilst maintaining their intended functional effect of said components.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the disclosure in the context of a lithographic apparatus, embodiments of the disclosure may be used in other apparatus. Embodiments of the disclosure may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

While specific embodiments of the disclosure have been described above, it will be appreciated that the disclosure may be practiced otherwise than as described. The descriptions above are intended to be illustrative, not limiting. Thus, it will be apparent to one skilled in the art that modifications may be made to the disclosure as described without departing from the scope of the claims set out below.

The invention claimed is:

1. A particle beam apparatus, comprising:
   a conductive object; and
   an object table configured to support an object, the object table comprising:
   a table body; and
   a conductive coating provided on at least a portion of a surface of the table body;
   wherein the conductive object is disposed such that at least part of the conductive object faces the conductive coating, and wherein the table body is provided with a profile shape that includes a deviation in shape of the surface of the table at or near an edge portion of the conductive coating, said deviation being arranged so as to reduce an electric field strength in the vicinity of the edge portion when a voltage is applied to both the conductive object and the conductive coating.

2. The particle beam apparatus according to claim 1, wherein said deviation has a component that lies out of a main plane of the conductive coating, and wherein the edge portion of the conductive coating is disposed on said deviation.

3. The particle beam apparatus according to claim 2, wherein there is a greater distance between the conductive object and the component that lies out of the main plane of the conductive coating than a distance between the conductive object and the main plane of the conductive coating.

4. The particle beam apparatus according to claim 3, wherein the deviation comprises a groove.

5. The particle beam apparatus according to claim 4, wherein the groove comprises a cross-section which is a segment of a circle or generally rectangular with rounded edges.

6. The particle beam apparatus according to claim 4, wherein the deviation comprises a secondary groove provided on the surface of the table body.

7. The particle beam apparatus according to claim 4, further including an insulating material that covers an intersection between the table body and the edge portion of the conductive coating.

8. The particle beam apparatus according to claim 7, wherein the insulating material is arranged in the groove.

9. The particle beam apparatus according to claim 1, wherein the deviation comprises a groove, and wherein the edge portion of the conductive coating is disposed at or near said groove and wherein a conductor is provided within the groove.

10. The particle beam apparatus according to claim 1, wherein the particle beam apparatus is an electron beam apparatus, a scanning electron microscope, an electron beam direct writer, an electron beam projection lithography apparatus, an electron beam inspection apparatus, an electron beam defect verification apparatus, or an electron beam metrology apparatus.

11. The particle beam apparatus of claim 1, wherein a position of the conductive object with respect to a vacuum chamber of the particle beam apparatus is fixed.

12. A particle beam apparatus, comprising:
    a conductive object; and
    an object table configured to support an object, the object table comprising:
    a table body; and
    a conductive coating provided on at least a portion of a surface of the table body;
    wherein the conductive object is disposed such that at least part of the conductive object faces the conductive coating, and wherein an insulating material covers an intersection between the table body and an edge portion of the conductive coating, said insulating material being arranged so as to reduce an electric field strength in the vicinity of the edge portion when a voltage is applied to both the conductive object and the conductive coating.

13. The particle beam apparatus according to claim 12, wherein the insulating material substantially covers the entirety of the conductive coating.

14. The particle beam apparatus according to claim 12, wherein the insulating material covers only a portion of the conductive coating.

15. The particle beam apparatus according to claim 12, wherein the insulating material is in contact with one or more intersections between the table body and the edge portion of the conductive coating.

16. The particle beam apparatus according to claim 12, wherein an intersection between the table body and the edge portion of the insulating material is arranged in a region where an electric field strength is lower than an electric field strength in a region of intersection between the table body and the edge portion of the conductive coating.

17. The particle beam apparatus according to claim 12, wherein a dielectric constant of the insulating material is greater than a dielectric constant of the table body.

18. An object table configured to support an object, the object table comprising:

a table body; and a conductive coating provided on at least a portion of a surface of the table body, wherein a conductive object is disposed such that at least part of the conductive object faces the conductive coating, and wherein the table body is provided with a feature at or near an edge portion of the conductive coating, said feature being arranged so as to reduce an electric field strength in the vicinity of the edge portion when a voltage is applied to both the conductive object and the conductive coating.

19. The object table of claim 18, wherein the feature comprises an insulating material that covers an intersection between the table body and the edge portion of the conductive coating.

20. The object table of claim 19, wherein the insulating material is arranged in a groove.

21. The object table of claim 18, wherein a position of the table body with respect to a vacuum chamber of a particle beam apparatus is movable.

* * * * *